(12) United States Patent
Tsukihara et al.

(10) Patent No.: US 6,797,968 B2
(45) Date of Patent: Sep. 28, 2004

(54) ION BEAM PROCESSING METHOD AND APPARATUS THEREFOR

(75) Inventors: Mitsukuni Tsukihara, Ehime (JP); Yoshitaka Amano, Toyo (JP); Mitsuaki Kabasawa, Saijo (JP); Michiro Sugitani, Niihama (JP); Hiroki Murooka, Saijo (JP); Hiroshi Matsushita, Toyo (JP)

(73) Assignee: Sumitomo Eaton Nova Corporation, Tokyo (JP)

( * ) Notice: Subject to any disclaimer, the term of this patent is extended or adjusted under 35 U.S.C. 154(b) by 0 days.

(21) Appl. No.: 10/329,560

(22) Filed: Dec. 27, 2002

(65) Prior Publication Data

US 2003/0122090 A1 Jul. 3, 2003

(30) Foreign Application Priority Data

Dec. 27, 2001 (JP) ........................................ 2001-397817

(51) Int. Cl.$^7$ .............................. H01J 37/08; G21G 5/00
(52) U.S. Cl. .............................. 250/492.21; 250/492.3; 250/396 ML
(58) Field of Search ........................ 250/492.21, 492.3, 250/396 ML, 396 R

(56) References Cited

U.S. PATENT DOCUMENTS

| | | | | |
|---|---|---|---|---|
| 4,293,794 A | * | 10/1981 | Kapetanakos | 315/111.81 |
| 4,466,242 A | * | 8/1984 | Sovey et al. | 60/202 |
| 5,296,714 A | * | 3/1994 | Treglio | 250/492.3 |
| 5,576,538 A | | 11/1996 | Sakai et al. | 250/251 |
| 5,675,606 A | * | 10/1997 | Brainard et al. | 315/111.71 |
| 5,703,375 A | * | 12/1997 | Chen et al. | 250/492.21 |
| 5,838,522 A | * | 11/1998 | Komvopoulos et al. | 360/122 |
| 6,184,625 B1 | * | 2/2001 | Ogura et al. | 315/111.81 |
| 6,294,862 B1 | * | 9/2001 | Brailove et al. | 313/363.1 |
| 6,323,493 B1 | | 11/2001 | Keller et al. | 250/396 |
| 6,414,329 B1 | * | 7/2002 | Benveniste et al. | 250/492.21 |
| 6,541,781 B1 | * | 4/2003 | Benveniste et al. | 250/492.21 |
| 6,703,628 B2 | * | 3/2004 | Ye et al. | 250/492.21 |

FOREIGN PATENT DOCUMENTS

| | | |
|---|---|---|
| EP | 1 176 623 A2 | 1/2002 |
| EP | 1 178 624 A2 | 1/2002 |
| GB | 2 378 313 A | 2/2003 |
| JP | 2765111 | 4/1998 |
| JP | 11-96961 | 4/1999 |
| JP | 2001-11608 | 1/2001 |

* cited by examiner

Primary Examiner—John R. Lee
Assistant Examiner—Kalimah Fernandez
(74) Attorney, Agent, or Firm—Arent Fox, PLLC.

(57) ABSTRACT

An ion beam processing apparatus comprises a beam line vacuum chamber from an ion source to a processing chamber. The apparatus further comprises a beam line structure for transporting ion beam from the ion source through the beam line vacuum chamber to the processing chamber. A mass analysis magnet unit is arranged from the outside in a partial section of the beam line vacuum chamber. An effective magnetic field area of the mass analysis magnet unit is disposed in a partial section of the beam line structure. Continuous cusp field forming magnet apparatuses are arranged at the series of beam line vacuum chamber part of the beam line structure to confine ion beam by forming continuous cusp fields.

72 Claims, 22 Drawing Sheets

FIG. 1 RELATED ART    PRIOR ART

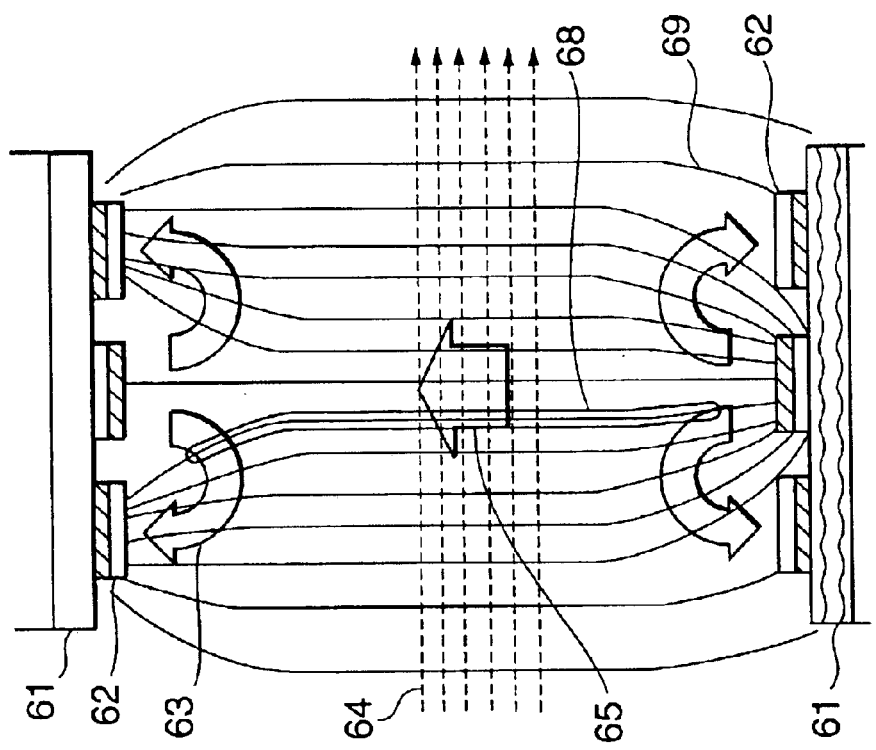
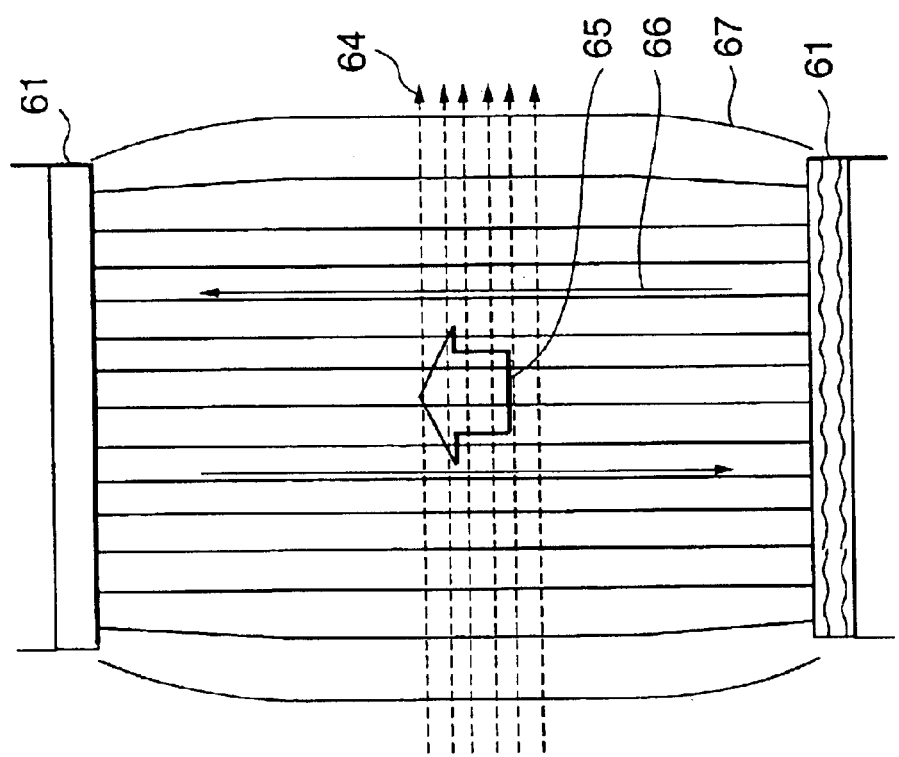

ION BEAM PROCESSING METHOD AND APPARATUS THEREFOR

This application claims priority to prior application JP 2001-397817, the disclosure of which is incorporated herein by reference.

BACKGROUND OF THE INVENTION

The present invention relates to an ion beam processing method and an ion beam processing apparatus.

There are various types of usage for the ion beam processing apparatus. For example, it is used as an ion implantation system. The ion implantation system is for implanting ions in semiconductor devices. For recent ion implantation system, following development and progress in a microfabrication technology of a semiconductor device, the energy of implanted ions is decreasing in order to implant the ions shallowly in the semiconductor substrate. However, in low ion energy range, in the midway of a beam line structure from an ion source to the semiconductor substrate, ion beam spreads because of charges of their own. This is because repulsion is attributed to a space charge effect. Therefore, in the low ion energy range, transport efficiency of ion beam is reduced, which causes a problem not to get sufficient ion beam current.

In ion beam, because of the electrical repulsive force: space charge effect, each positive ion bears off other positive ions. As a result, the ion beam is diffused. The space charge effect works more strongly as ion beam energy is lower, and also as ion beam current is higher.

Thus, especially in the low energy ion implantation, in order to obtain higher ion beam current, it is important to reduce the space charge effect and to prevent from diffusion of ion beam.

The space charge effect by ions having positive charges is mitigated by an amount equal to cancellation of total charges in a space if there are electrons or ions having negative charges. For example, as shown by P1 to P6 of FIG. 1, secondary electrons generated from a surface of a structure when ion beam collide with the structure in the beam line structure, electrons emitted when ion beam collide with gas remaining in the beam line structure to ionize the residual gas, or negative ions generated by electron impartation act to mitigate the space charge effect.

The space charge effect by positive ions is mitigated by amount of electrons secondarily emitted by ion impact to the beam line structure, by ion collisions with residual gas in the beam line structure or so. Negative ions, generated by capture of the secondary electrons, also mitigate the space charge effect.

Referring to FIG. 1, ions are generated by an ion source 200, and are extracted by an extraction electrode 201 as ion beam. The ion beam is transported in a vacuum chamber 202 and passes through an analysis slit 203 and are irradiated to a target semiconductor substrate 204. A mass analysis magnet unit is arranged outside the vacuum chamber 202, which is not shown here.

In FIG. 1, P1 denotes collision of ion beam with the extraction electrode 201, P2 collision of heavier ions than target ions with the inner wall of the vacuum chamber 202, P3 collision of ions with residual gas, P4 collision of lighter ions than the target ions with the inner wall of the vacuum chamber 202, P5 collision of ion beam with the analysis slit 203, and P6 collision of ion beam with the semiconductor substrate 204.

The following method is known, which actively induces the above-described operation in order to reduce the space charge effect and to increase beam current ultimately. Gas is intentionally introduced into the vacuum chamber constituting the beam line structure, and the space charge effect is reduced by electrons ejected by collision ionization of the gas with ions. This method is disclosed in, for example Japanese Patent No. 2765111. Simply put, when gas is introduced into an ion beam transport line, collision of ions of ion beam with the gas molecules is increased. As a result, the amount of electrons present in the ion beam is substantially increased to mitigate the space charge effect of the ion beam.

In addition to the above method, another method is known using the neutralization by the molecules that are easily turned to negative ions or are easily polarized, e.g., water ($H_2O$). This method serves the same purpose as that of the above, and disclosed in Japanese Patent Application Laid-Open No. Hei 11 (1999)-96961.

The method based on the gas introduction increases the amount of generated electrons, results in loss of ion beam by collision with the gas. Generally, a beam current is maximized under a certain gas pressure and, even if more gas is introduced, ion beam current will decrease.

Thus, the amount of electrons is decided by balance of generation and disappearance of electrons. In order to completely cancel the space charge effect, this balance must be changed and the number of electrons must be increased.

From another standpoint, to substantially increase the amount of electrons, necessary for neutralization of ion beam, without any losses of ion beam themselves, a method of extending the life time of electrons or negative ions which have been present from generation to disappearance is effective.

In addition, for the conventional ion implantation system, between the both poles of the mass analysis magnet unit, a detachable/separable mass analysis magnet unit beam line vacuum chamber is arranged to transport ion beam while analyzing mass. The ion beam passed in the mass analysis magnet unit beam line vacuum chamber are diffused to reduce beam current.

Especially, in the low ion energy range, a reduction in beam current is significant. As a method of obtaining much more beam current in the low energy range, a deceleration mode is known. However, even by the deceleration mode, diffusion of ion beam cannot be suppressed.

As a method of suppressing diffusion of ion beam, application of a continuous cusp field in the ion beam is known to be effective. However, in the conventional ion implantation system, it is difficult to secure space for forming a cusp field.

Further, in the conventional ion implantation system, to use an apparatus with deceleration mode, the analysis magnetic pole surfaces of the mass analysis magnet unit, the magnets for forming the cusp field, and the beam line vacuum chamber must be set to different potentials. However, it is difficult to secure a space for arranging the magnets for forming the cusp field, and then a space for arranging its insulating material. The insulating material can be arranged by increasing a distance between the analysis magnetic pole surfaces of the mass analysis magnet unit. However, when the distance between the both pole surfaces of the mass analysis magnet unit is increased, electric power consumption necessity for analyzing mass of ion beam will increase.

At present, demand for space and energy conservation grows in the industrial field, and increases in size of the apparatus and electric power consumption run counter to such demand.

SUMMARY OF THE INVENTION

Therefore, a purpose of the present invention is to enable acquisition of higher beam current by forming a cusp field in a beam line structure of an ion beam processing apparatus in order to suppress diffusion of ion beam, and to transport much more ion beam.

Another purpose of the present invention is to increase the ion beam current easily in low energy range in an ion implantation system for implanting ions in semiconductor substrate such as silicon wafer.

Yet another purpose of the present invention is to provide an effective supporting method and an effective supporting structure of a set of magnets for forming a cusp field in a beam line structure.

An ion beam processing method of the present invention subjects ions extracted from an ion source by an extraction electrode to mass analysis by a mass analysis magnet unit and by a mass analysis slit, and are drifted or accelerated/decelerated to implant the ions in a substrate.

According to a first aspect of the present invention, a set of magnets for forming continuous cusp fields is continuously disposed in a continuous beam line structure from front part of the mass analysis magnet unit through the mass analysis magnet unit to rear part of the mass analysis magnet unit. Thus, the ion beam is continuously confined by magnetic field.

In the ion beam processing method of the first aspect, the continuous cusp fields may be formed so as to be uniform magnetic field strength, or different magnetic field strength in accordance with each section of the beam line structure.

According to a second aspect of the present invention, an ion beam processing method is applied to an ion implantation system for subjecting ions extracted from an ion source by an extraction electrode to mass analysis by a mass analysis magnet unit and a mass analysis slit, and drifting or accelerating/decelerating the ions to implant the ions in a substrate. The ion beam processing method comprise the steps of: confining the ion beam by continuous magnetic field in a beam line structure from the vicinity of the extraction electrode through the mass analysis magnet unit and the mass analysis slit to the vicinity of the substrate.

According to a third aspect of the present invention, an ion beam processing method comprises the steps of: confining the ion beam by continuous first cusp field in a continuous beam line structure from front part of the mass analysis magnet unit through the mass analysis magnet unit to rear part of the mass analysis magnet unit; forming the continuous cusp field; confining the ion beam by second cusp field different in magnetic field strength from the first cusp field in the beam line structure between the rear part of the mass analysis magnet unit and a substrate processing chamber; and in other word confining substantially the entire beam line structure by continuously disposing first and second magnetic fields.

In the ion beam processing method of the third aspect, the distance between cusp magnetic poles of the first and second cusp fields, or magnetic flux densities of the first and second cusp fields may be equal to each other or different from each other.

According to a fourth aspect of the present invention, an ion beam processing method is applied to an ion beam processing apparatus having a beam line vacuum chamber from an ion source to a processing chamber. The ion beam processing method comprises the step of: confining ion beam by forming a beam line structure for ion beam transport from the ion source through the beam line vacuum chamber into the processing chamber, arranging a mass analysis magnet unit outside a partial section of the beam line vacuum chamber, disposing an effective magnetic field area of the mass analysis magnet unit in a partial section in the beam line structure, and forming continuous cusp fields in the beam line vacuum chamber and also in the effective magnetic field area of the mass analysis magnet unit in the beam line structure.

According to a fifth aspect of the present invention, an ion beam processing method comprises the step of: confining ion beam by forming a beam line structure for ion beam transport from the ion source through the beam line vacuum chamber into the processing chamber, arranging a mass analysis magnet unit outside a partial section of the beam line vacuum chamber, disposing an effective magnetic field area of the mass analysis magnet unit in a partial section in the beam line structure, and forming continuous cusp fields in the continuous beam line vacuum chamber of the beam line structure from front part of the mass analysis magnet unit before the effective magnetic field area through the effective magnetic field area of the mass analysis magnet unit to rear part of the beam line structure outside the effective magnetic field area of the mass analysis magnet unit.

According to a sixth aspect of the present invention, an ion beam processing method comprises the step of: confining ion beam by forming a beam line structure for ion beam transport from the ion source through the beam line vacuum chamber into the processing chamber, arranging a mass analysis magnet unit from the outside in a partial section of the beam line vacuum chamber, disposing an effective magnetic field area of the mass analysis magnet unit in a partial section in the beam line structure, and arranging a set of magnets for forming continuous cusp field in the continuous beam line vacuum chamber of the beam line structure from front part of the mass analysis magnet unit before the effective magnetic field area through the effective magnetic field area of the mass analysis magnet unit to rear part of the beam line structure outside the effective magnetic field area of the mass analysis magnet unit to form continuous cusp field.

In the ion beam processing method of each of the fourth to sixth aspects, the continuous cusp field is formed by disposing a plurality of opposing cusp field units in the beam line vacuum chamber.

An ion beam processing apparatus according to a first aspect of the present invention comprises: a beam line vacuum chamber extending from an ion source to a processing chamber; a beam line structure for transporting ion beam from the ion source through the beam line vacuum chamber to the processing chamber; a mass analysis magnet unit arranged outside the beam line vacuum chamber, an effective magnetic field area of the mass analysis magnet unit being disposed in a partial section of the beam line structure; and a set of continuous cusp field forming magnets arranged in the beam line vacuum chamber part of the beam line structure to confine ion beam by forming continuous cusp field.

An ion beam processing apparatus according to a second aspect of the present invention comprises: a beam line structure for transporting ion beam from an ion source through a beam line vacuum chamber to a processing chamber; a mass analysis magnet unit arranged from the outside in a partial section of the beam line vacuum chamber, an effective magnetic field area of the mass analysis magnet unit being disposed in a partial section of the beam line structure; and a set of continuous cusp field forming magnets arranged in the continuous beam line vacuum chamber part of the beam line structure from front part of the mass analysis magnet unit before the effective magnetic field area of the mass analysis magnet unit to rear part of the beam line structure outside the effective magnetic field area of the mass analysis magnet unit to confine ion beam by forming continuous cusp field.

In the ion beam processing apparatus of each of the first and second aspects, a plurality of continuous cusp field forming magnets may be fixed and may be held at regular intervals directly on an inner wall of the beam line vacuum chamber located in a section between the inner wall of the beam line vacuum chamber and the magnetic pole surface of the mass analysis magnet unit.

In the ion beam processing apparatus of each of the first and second aspects, a plurality of continuous cusp field forming magnets may be fixed and may be held at regular intervals directly on an outer wall of the beam line vacuum chamber located in a section between the inner wall of the beam line vacuum chamber and the magnetic pole surface of the mass analysis magnet unit.

In the ion beam processing apparatus of each of the first and second aspect, a plurality of continuous cusp field forming magnets may be fixed and may be held at regular intervals inside the beam line vacuum chamber located in a section between the inner wall of the beam line vacuum chamber and the magnetic pole surface of the mass analysis magnet unit.

In the ion beam processing apparatus of each of the first and second aspects, a plurality of continuous cusp field forming magnets may be fixed and may be held at regular intervals directly on an outer wall of the magnetic pole surface located in a section between the inner wall of the beam line vacuum chamber and the magnetic pole surface of the mass analysis magnet unit.

In the ion beam processing apparatus of each of the first and second aspects, a plurality of continuous cusp field forming magnets may be fixed and may be held at regular intervals inside the magnetic pole surface located in a section between the inner wall of the beam line vacuum chamber and the magnetic pole surface of the mass analysis magnet unit.

An ion beam processing apparatus according to a third aspect o the present invention comprises: a beam line structure for transporting ion beam from an ion source through a beam line vacuum chamber to a processing chamber, a section of the beam line vacuum chamber constituting the beam line structure being tubular with polygonal or circular section perpendicular to the beam direction, an inner side wall of the tubular beam line vacuum chamber being thin in a partial section or all sections of the beam line vacuum chamber constituting the beam line structure; and reinforcing members arranged outside the inner side wall.

An ion beam processing apparatus according to a fourth aspect of the present invention comprises: a beam line structure for ion beam transport from an ion source through a beam line vacuum chamber to a processing chamber, a section of the beam line vacuum chamber constituting the beam line structure being tubular with polygonal or circular section perpendicular to the beam direction, an outer side wall of the tubular beam line vacuum chamber being thin in a partial section or all sections of the beam line vacuum chamber constituting the beam line structure; and reinforcing members and inner wall members arranged inside the outer side wall.

In the ion beam processing apparatus of each of the third and fourth aspects, a partial section of the beam line vacuum chamber constituting the beam line structure includes a section of a mass analysis magnet unit arranged in a position near the ion source of the beam line vacuum chamber constituting the beam line structure (first modified example).

In the ion beam processing apparatus according to the first modified example, the third and fourth aspects, the reinforcing members may be arranged at regular intervals.

In the ion beam processing apparatus according to the first modified example, the third and fourth aspects, a plurality of continuous cusp field forming magnets may be arranged as the reinforcing members at regular intervals.

In the ion beam processing apparatus according to the first modified example, the third and fourth aspects, the reinforcing members and a plurality of continuous cusp field forming magnets may be alternately arranged at regular intervals (second modified example).

In the ion beam processing apparatus according to the first modified example, the third and fourth aspects, in accordance with the shape of the tubular beam line vacuum chamber with polygonal or circular section, the reinforcing members and a plurality of continuous cusp field forming magnets may be alternately arranged at regular intervals in at least a group of opposing locations of the tubular beam line vacuum chamber with polygonal or circular section.

In the ion beam processing apparatus according to the first modified example, the third and fourth aspects, the reinforcing members may be arranged as reinforcing ribs at proper intervals in a direction perpendicular or obliquely to the beam line structure, or in the same direction as the beam line structure.

In the ion beam processing apparatus according to the second modified example, the reinforcing members and the continuous cusp field forming magnets may be alternately arranged closely.

In the ion beam processing apparatus according to the second modified example, the inner side or outer side wall of the beam line vacuum chamber constituted to be thin, may be thick in a part where no reinforcing member is disposed, in accordance with the shape of the tubular beam line vacuum chamber with polygonal or circular section.

In the ion beam processing apparatus according to each of the first and second aspects, a plurality of continuous cusp field forming magnets may be fixed and may be held at regular intervals directly to the beam line vacuum chamber (third modified example).

In the ion beam processing apparatus according the third modified example, concaves may be formed outside the beam line vacuum chamber to embed the plurality of cusp field forming magnets, and thus the plurality of cusp field forming magnets may be arranged so as to close to the inside of the beam line vacuum chamber, i.e., to a vacuum side (fourth modified example).

In the ion beam processing apparatus of the fourth modified example, the plurality of cusp field forming magnets may be directly fitted to be fixed in the concaves of the beam line vacuum chamber, whereby strength of the beam line vacuum chamber can be increased.

An ion beam processing apparatus according to a fifth aspect of the present invention comprises: a beam line vacuum chamber including effective magnetic field area of a mass analysis magnet at least partially, and the plurality of continuous cusp field forming magnets arranged to the continuous beam line vacuum chamber including the effective magnetic field area of the mass analysis magnet unit and also including the back and forward area of the effective magnetic field area.

In the beam line structure, the plurality of the continuous cusp field forming magnets are fixed to be held at regular intervals in the magnet pole surface side of the mass analysis magnet unit by a hold member.

In the ion beam processing apparatus of the fifth aspect, in the beam line vacuum chamber of the front and rear parts of the effective magnetic field area of the mass analysis magnet unit, a support member for fixing the hold member may be mounted on the magnetic pole surface of the mass analysis magnet unit, and the plurality of continuous cusp field forming magnets may be fixed to be held at regular intervals in the magnetic pole surface of the mass analysis magnet unit and the hold member by a support member.

In the ion beam processing apparatus of the fifth aspect, concaves may be formed in parts of the beam line vacuum chamber corresponding to the plurality of cusp field forming magnets fixed at the regular intervals to the magnetic pole surface of the mass analysis magnet unit and the hold member by the support member, and thus the cusp field forming magnets may be arranged so as to close to the inside of the beam line vacuum chamber, i.e., to the vacuum side.

In the ion beam processing apparatus of the fifth aspect, the hold member, the support member, or the fixing member for fixing and holding the cusp field forming magnets arranged between the magnetic pole surface of the mass analysis magnet unit and the beam line vacuum chamber, may be implemented by an insulating material to function as an insulator between the magnetic pole surface of the mass analysis magnet unit and the beam line vacuum chamber.

In the ion beam processing apparatus of each of the first and second aspects, a plurality of continuous cusp field forming magnets may be fixed to be held at regular intervals to the beam line vacuum chamber by a support member.

In the ion beam processing apparatus of each of the first and second aspects, concaves may be formed in the beam line vacuum chamber to arrange the cusp field forming magnets therein, whereby the cusp field magnets are arranged so as to close to the inside of the beam line vacuum chamber, i.e., to the vacuum side.

In the ion beam processing apparatus of each of the first and second aspects, concaves may be formed only in a necessary part of the beam line vacuum chamber to form a part of no reduction in thickness, whereby strength is provided to prevent destruction by a vacuum pressure.

In the ion beam processing apparatus of each of the first and second aspects, a support member for fixing and holding the cusp field forming magnets arranged between the magnetic pole surface of the mass analysis magnet and the beam line vacuum chamber may be implemented by an insulating material to function as an insulator between the magnetic pole surface of the mass analysis magnet unit and the beam line vacuum chamber.

In the ion beam processing method of each of the fourth to sixth aspects, an ion beam processing apparatus according to a sixth aspect of the present invention is provided by fixing a plurality of continuous cusp field forming magnets at regular intervals inside the beam line vacuum chamber.

In the ion beam processing apparatus of the sixth aspect, a magnet cover may be disposed to prevent exposure of the cusp field forming magnets to ion beam.

In the ion beam processing apparatus of the sixth aspect, the cusp field forming magnets may be fixed to be held in the beam line vacuum chamber directly or through a hold member.

In the ion beam processing apparatus of the sixth aspect, space parts may be formed inside the wall of the beam line chamber to embed the cusp field forming magnets.

In the ion beam processing apparatus of the sixth aspect, the cusp field forming magnets may be fixed to be held inside the beam line vacuum chamber through a cover hold member.

In the ion beam processing apparatus of the sixth aspect, concaves may be formed in the vacuum side of the beam line vacuum chamber to embed the cusp field forming magnets, whereby the cusp field forming magnets are arranged so as to close to the inside of the beam line vacuum chamber, i.e., to the vacuum side.

According to the present invention, an ion beam processing apparatus may comprise a continuous beam line structure from front part of the mass analysis magnet unit to rear part thereof, wherein the beam line structure is constituted to be partially detachable in order to widen one magnetic pole surface of the mass analysis magnet unit in spacing with respect to the other magnetic pole surface.

BRIEF DESCRIPTION OF THE DRAWING

FIGS. 14A and 14B are views respectively showing a relation between a magnetic field of a mass analysis magnet and ion beams, and a relation between a magnetic field and ion beams when a magnet for forming a cusp field is arranged in a magnetic pole of the mass analysis magnet;

DESCRIPTION OF THE PREFERRED EMBODIMENTS

Before description of the preferred embodiments of the present invention, a beam line structure in an ion implantation system will be described by referring to FIG. 2. This ion implantation system is an example of an ion beam processing apparatus to which the present invention is applied.

Figure 1:
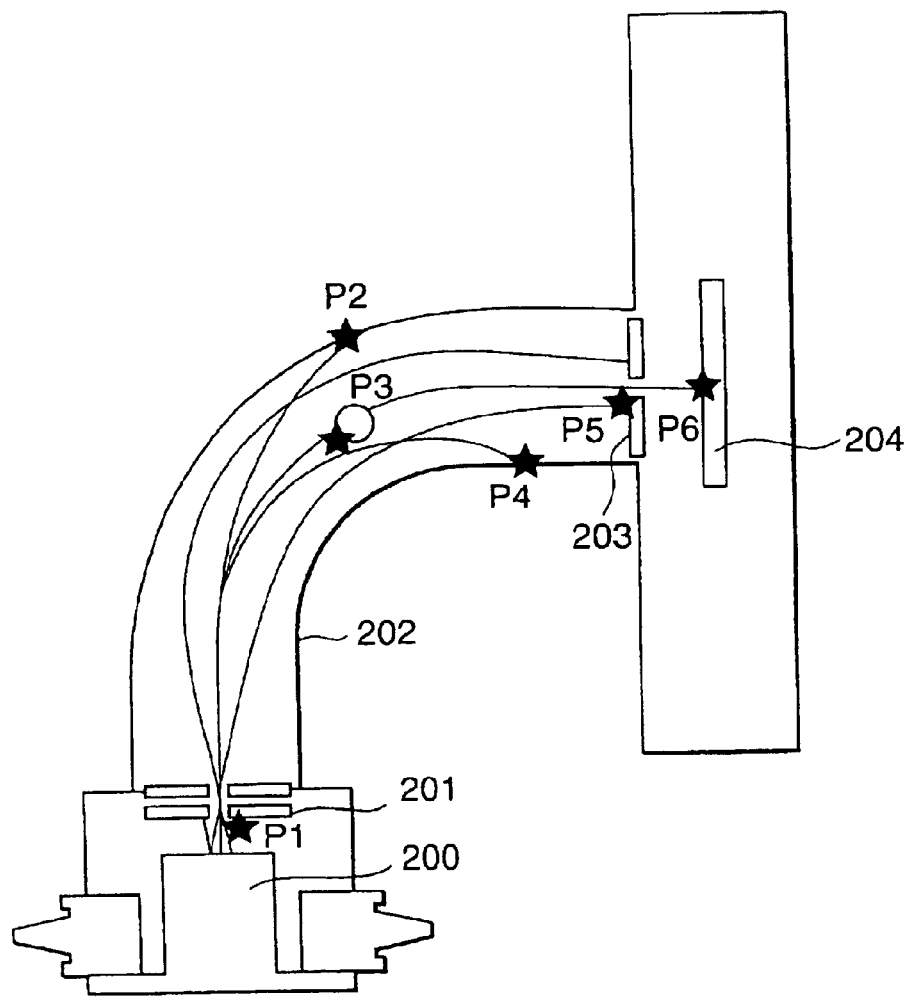
FIG. 1 is an explanatory view showing generation of secondary electrons by ion beams in an ion implantation system.
Figure 2:
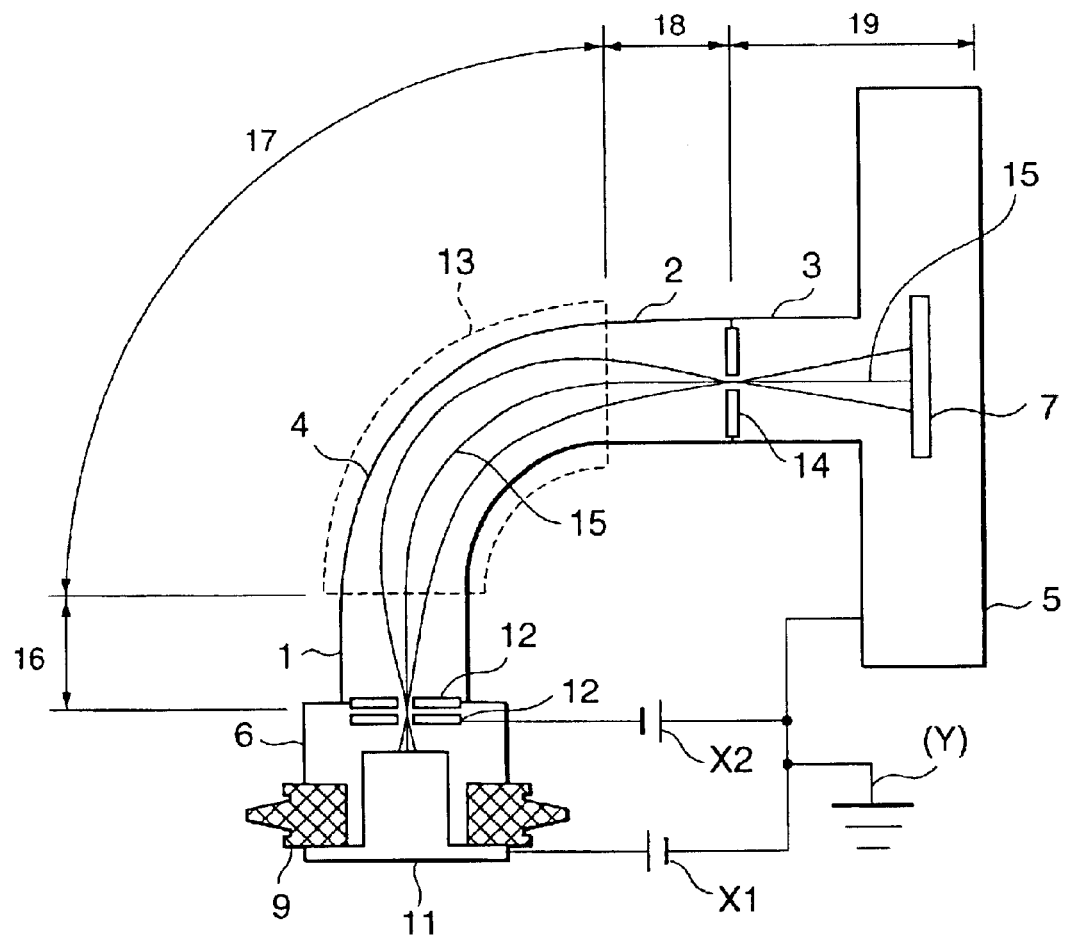
FIG. 2 is a sectional view showing a generation configuration of an ion implantation system to which the present invention is applied.

In FIG. 2, ions 15 extracted from an ion source 11 by an extraction electrode 12 are analyzed by a mass analysis magnet unit 13, and a mass analysis slit 14 located after the magnet unit 13, and only necessary ion species is selected to be transported to a semiconductor substrate 7 which is a target.

A space for transporting ion beam is divided into the following four sections:

(1) a front section 16 which is from the extraction electrode 12 present after the ion source 11 to the mass analysis magnet unit 13;

(2) a magnet section 17 which is in the mass analysis magnet unit 13;

(3) a rear section 18 which is from the mass analysis magnet unit 13 to the mass analysis slit 14; and (4) an implantation section 19 which is from the mass analysis slit 14 to the semiconductor substrate 7.

A beam line vacuum chamber is constituted of a joint housing 1 corresponding to the front section 16 from the extraction electrode 12 to the mass analysis magnet unit 13, a beam guide 4 corresponding to the magnet section 17, a joint housing 2 corresponding to the rear section 18, a joint housing 3 from a part of the implantation section 19, i.e., the mass analysis slit 14, to a wafer processing chamber 5, and the like. The ion source 11 and a source housing 6 are insulated from each other by an insulator 9. A positive side of a power source X1 is connected to the ion source 11, while a negative side of another power source X2 is connected to the extraction electrode 12. The negative and positive sides of the power sources X1 and X2 are connected to the wafer processing chamber 5 to be grounded. The front section 16 and the magnet section 17 may be referred to as first cusp field sections, while the rear section 18 and the implantation section 19 may be referred to as second cusp field sections. An area in which magnetic poles of the mass analysis magnet are present can be defined as an effective magnetic field area of the mass analysis magnet.

Figure 3:
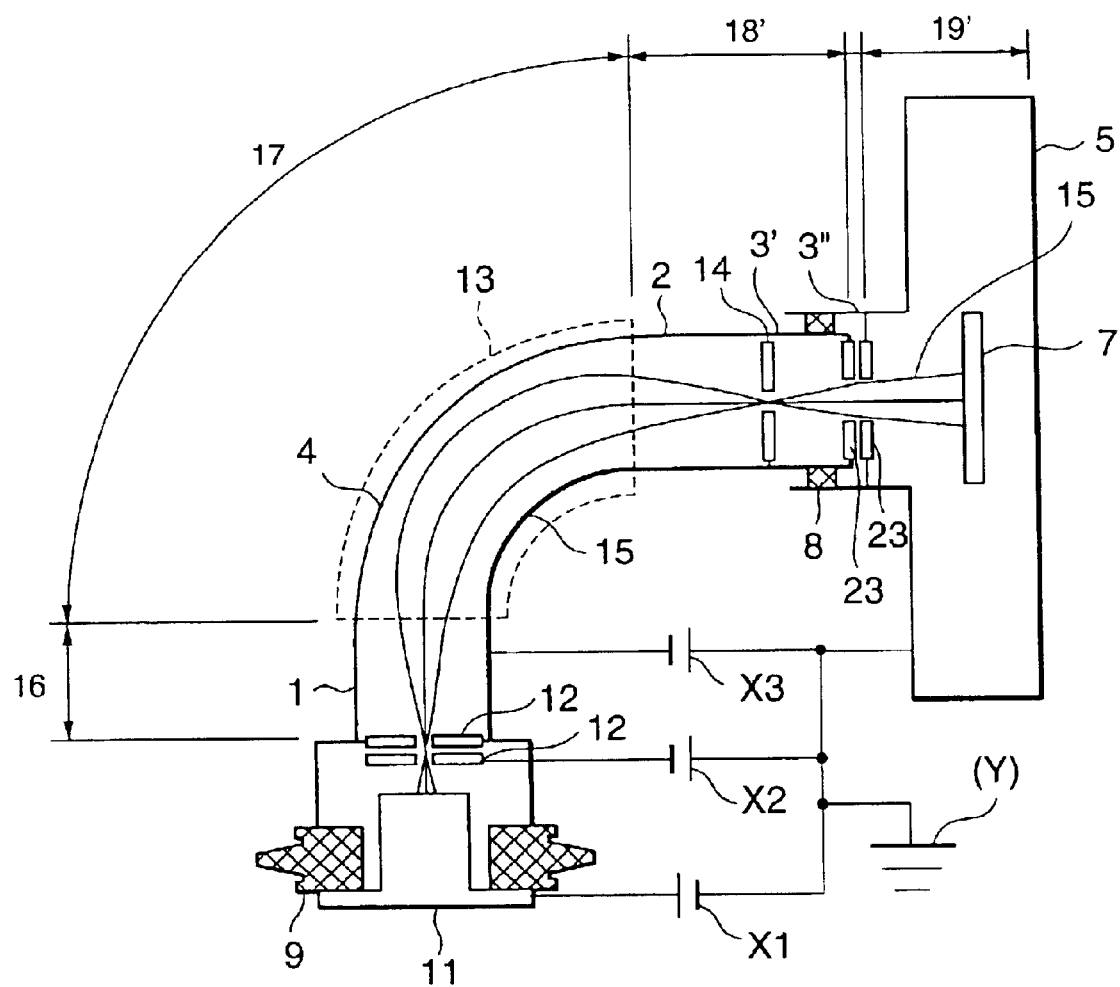
FIG. 3 is a sectional view showing a generation configuration of an ion implantation system equipped with a post-deflection deceleration or acceleration function, to which the present invention is applied.

FIG. 3 shows a beam line structure of an ion implantation system using post-deflection deceleration or acceleration, and portions similar to those of FIG. 2 are denoted by similar reference numerals. In FIG. 3, ions extracted from the ion source 11 are analyzed by the mass analysis magnet unit 13, and the mass analysis slit 14 located after the magnet unit 13, and only required ion species is selected. After passage through the mass analysis slit 14, the ions are post-decelerated or post-accelerated by a rear electrode 23. Deceleration or acceleration of ions is decided by a direction of an electric field applied to the rear electrode 23. That is, deceleration is executed in the case of a backward electric field, and acceleration is executed in the case of a forward electric field.

Normally, the mass analysis slit 14 is disposed in the vicinity of an upstream side of the rear electrode 23. However, a part of the rear electrode 23 may also function as the mass analysis slit 14.

In the ion implantation system using such post-deceleration or post-acceleration, space for transporting ion beam is also divided into the following four sections:

(1) a front section 16 which is from the extraction electrode 12 to the mass analysis magnet unit 13;

(2) a magnet section 17 which is in the mass analysis magnet unit 13;

(3) a rear section 18 which is from the mass analysis magnet unit 13 to the rear electrode 23; and (4) an implantation section 19 which is from the rear electrode 23 to the semiconductor substrate 7.

A negative side of a power source X3 is connected to the joint housing 1, while a positive side thereof is connected to the wafer processing chamber 5 to be grounded. The mass analysis slit 14 and a forefront of the rear electrode 23 are connected to each other by a joint housing 3', and a periphery of the joint housing 3' and the wafer processing chamber 5 are connected to each other by a joint housing 3". An insulating member 8 is provided between the joint housing 3' and the joint housing 3". That is, before and after the rear electrode 23, there are two spaces, one from the mass analysis magnet unit 13 to the rear electrode 23, and the other from the rear electrode 23 to the semiconductor substrate 7. Since there are no electric fields inside, the structures of FIGS. 2 and 3 are substantially similar to each other in motion of electrons.

The present invention is characterized by adoption of a method of confining electrons in a space of a beam line structure by a magnetic field to reduce electron disappearance of ion beam in the beam line structure in an ion implantation system similar to that shown in each of FIGS. 2 and 3.

Figure 4A:
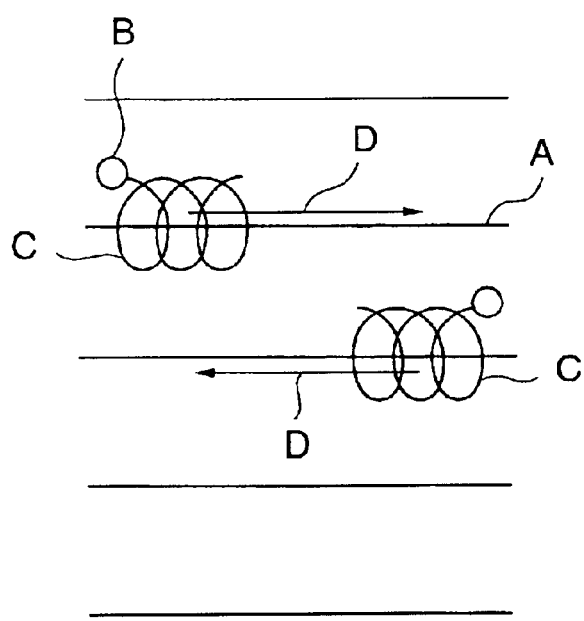
FIGS. 4A and 4B are explanatory views respectively showing electron orbit in a roughly uniform magnetic field, and electron orbit in a nonuniform magnetic field.
Figure 4B:
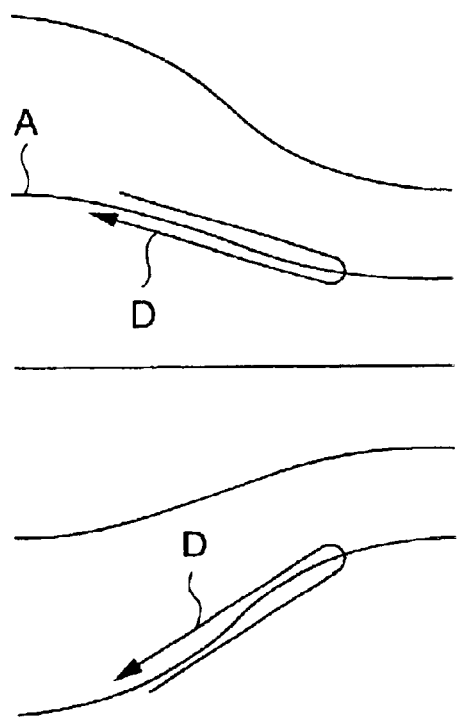

Referring to FIGS. 4A and 4B, here describes a method of confining electrons in a beam line structure by a magnetic field. FIG. 4A shows electron path in a roughly uniform magnetic field, and FIG. 4B shows electron paths of guiding center of electrons in a nonuniform magnetic field. A reference code A denotes a line of magnetic force, B an electron, C rotation orbit of the electron B, and D path of guiding center of the electron B.

The electron B rotates around the magnetic force line A in a magnetic field. The path D of the guiding center is, as shown in FIG. 4A, along the magnetic force line A in a magnetic field of uniform strength. However, as shown in FIG. 4B, electrons are repelled if they travel in a direction where lines of magnetic force A converge, i.e., a direction where a magnetic field becomes stronger. Generally, near a magnetic pole, because of magnetic force line convergence, electrons cannot travel toward the magnetic pole. Thus, if such a magnetic pole is arranged on a wall surface of the beam line vacuum chamber, the electrons cannot approach the wall, whereby electron disappearance is reduced. Therefore, the entire wall surface has an electron confinement effect.

Figure 5:
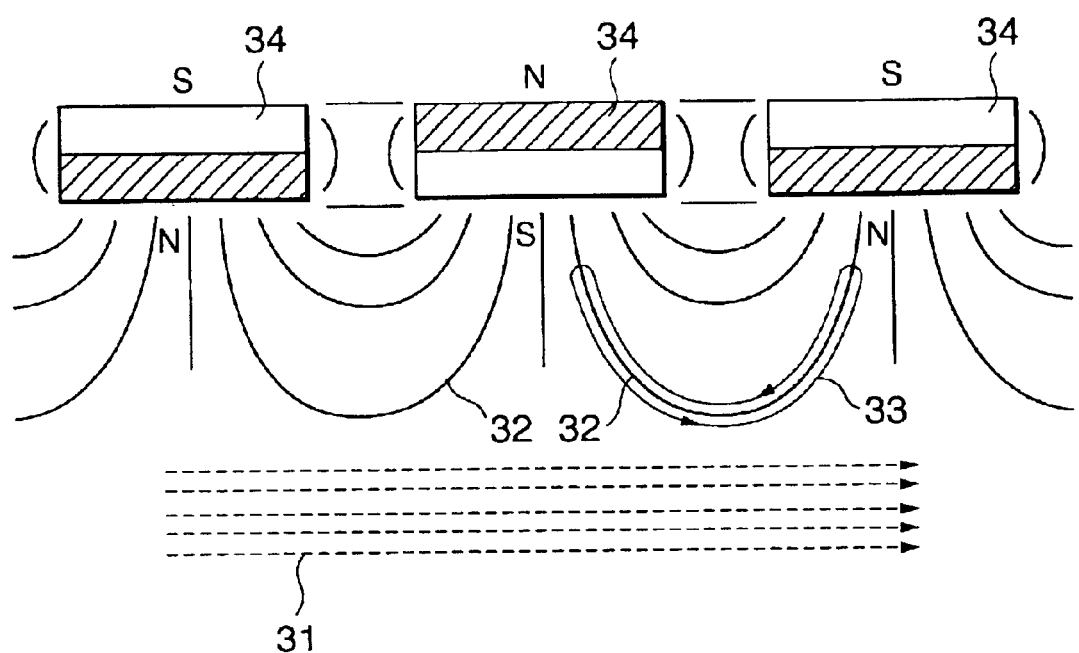
FIG. 5 is an explanatory view showing electron orbit in a cusp field.

As shown in FIG. 5, a magnet 34 covering a wall of a beam line vacuum chamber is formed in a manner that along ion beam path 31, a surface of the ion beam path 31 side alternately becomes an N pole and an S pole repeatedly, and a magnetic field by these magnets is generally referred to as a cusp field. Under the cusp field, electrons moves in a spiral around a magnetic force line 32. However, the electrons are repelled before reaching a magnetic pole of the magnet 34, and electron path 33 of a guiding center is kept in vacant space. That is, electrons in the vicinity of the beam path 31 become difficult to be lost, whereby the number of electrons present in the vicinity of the ion beam orbit 31 is substantially increased. As a result of the increased number of electrons in the vicinity of the ion beam orbit 31, the space charge effect of ion beam is mitigated to suppress diffusion and disappearance of ion beam. Thus, an ion beam current is increased.

Figure 6:
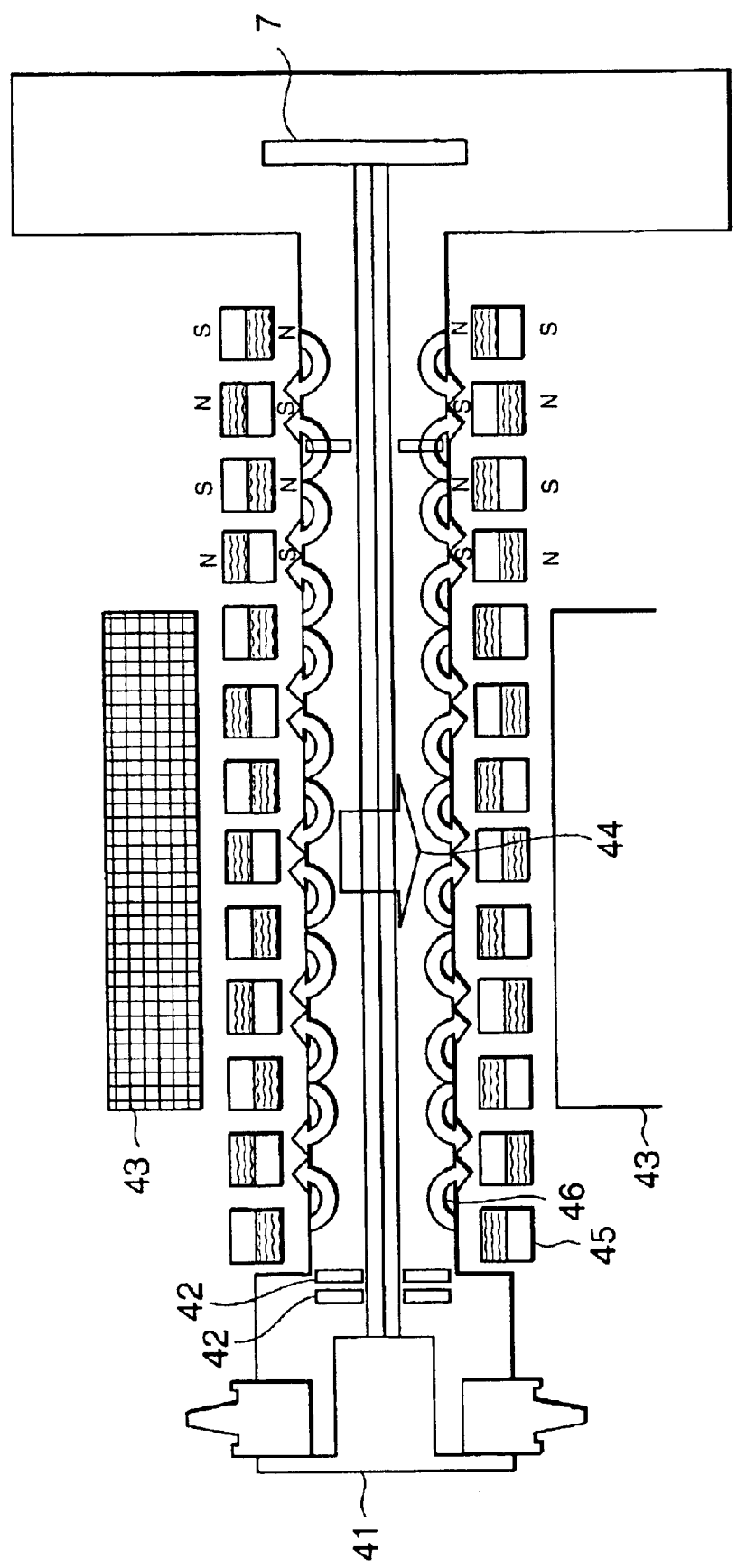
FIG. 6 is a sectional view showing arrangement of a magnet for forming a cusp field when the present invention is applied to the ion implantation system of FIG. 2.
Figure 7:
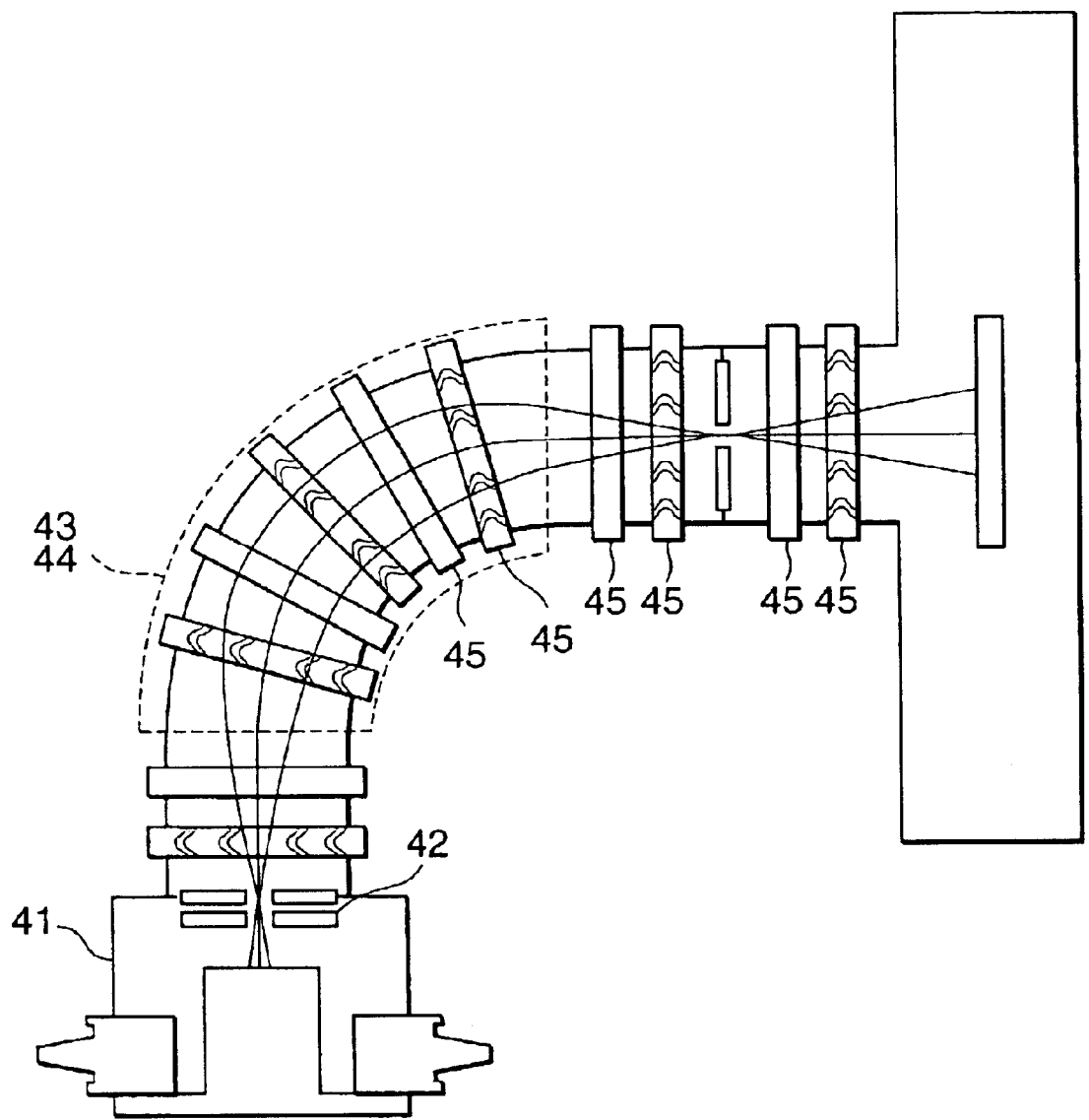
FIG. 7 is a plan view showing the arrangement of the magnet for forming a cusp field in FIG. 6.

In order to form such a cusp field, as shown in FIGS. 6 and 7, permanent magnets 45 similar in strength are arranged to place different magnetic poles oppositely to each other so that geometrical structures and magnetic fields are both symmetrical on a plane sandwiching a beam line structure. In FIGS. 6 and 7, an ion source 41, extraction electrodes 42, 42', mass analysis magnets 43, a mass analysis slit 14, a wafer processing chamber 5, and other components are similar to those shown in FIG. 2. In the permanent magnet 45 shown in each of FIGS. 6 and 7, a wave-pattern portion indicates an N pole, and a blank portion indicates an S pole. Preferably, the permanent magnets 45 are arranged such that distances from the beam line structure to the respective magnets can be equal to one another.

Because of such arrangement of the permanent magnets 45, magnetic fields cancel each other no the ion beam axis and remain any strong magnetic fields in the vicinity of the ion beam center.

Figure 8A:
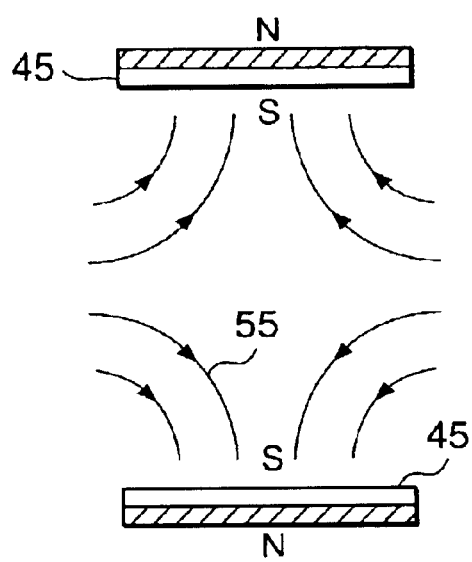
FIGS. 8A and 8B are explanatory views showing cusp fields when magnets for forming cusp fields are arranged on two sides, i.e., upper and lower surfaces.
Figure 8B:
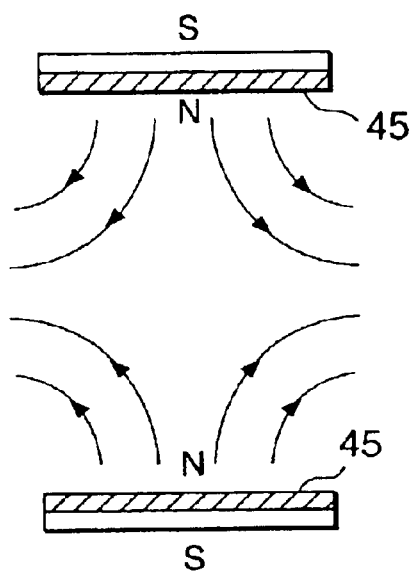
Figure 9:
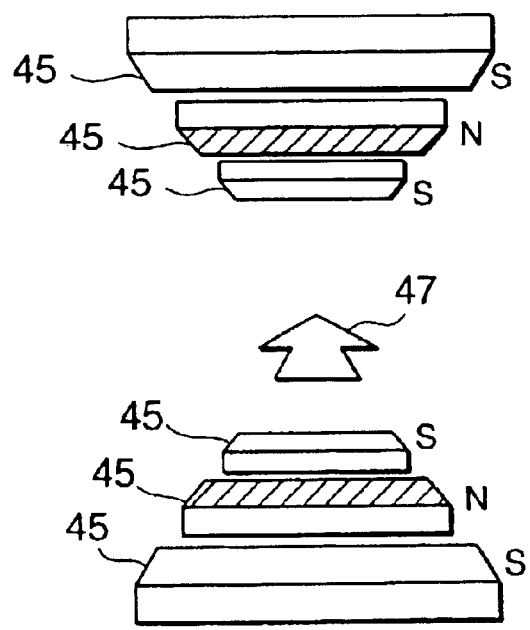
FIG. 9 is a view showing in perspective magnet arrangements of FIGS. 8A and 8B from a direction of ion beams.

FIGS. 8A and 8B show patterns where opposing arrangement of S poles of two permanent magnets 45, and opposing arrangement of N poles of two permanent magnets 45 in two opposing surfaces of the beam line structure, especially upper and lower surfaces, are alternately repeated in a traveling direction of ion beam. That is, in the traveling direction of ion beam, the arrangements of FIGS. 8A and 8B are alternately repeated. Perspective drawing of such arrangements seen from the same direction becomes similar to overall arrangement of FIG. 9. In upper and lower surfaces, S and N poles are alternately repeated in an ion beam traveling direction 47 to form a cusp field. A magnet for forming such a cusp field is a cusp field forming magnet.

As apparent from FIG. 7, the mass analysis magnet 43 is roughly fan-shaped in plane. In this case, the permanent magnet 45 arranged in an area corresponding to the mass analysis magnet 43 is increased in spacing from an inner diameter side to an outer diameter side of the mass analysis magnet 43. This means that strength of a cusp field formed by the permanent magnet 45 is reduced from the inner diameter side to the outer diameter side of the mass analysis magnet 43. Based on this consideration, to make cusp field strength uniform, a constitution may be adopted where magnetic field strength is increased from the inner diameter side to the outer diameter side of the mass analysis magnet 43.

For example, the permanent magnet 45 is divided into a plurality of sections in its magnetic pole direction, and different magnet materials are combined so as to increase magnetic field strength from the inner diameter side to the outer diameter side of the mass analysis magnet 43. Alternatively, a roughly fan shape is formed such that a magnetic pole width of the permanent magnet 45 can be enlarged from the inner diameter side to the outer diameter side of the mass analysis magnet 43. As a result, magnetic field can be increased from the inner diameter side to the outer diameter side of the mass analysis magnet 43.

Returning to FIG. 6, outside the opposing mass analysis magnets 43, i.e., outside a magnetic field 44 by the mass analysis magnets 43, the cusp field forming magnets are preferably installed to surround four surfaces of the beam line structure so that an electron confinement effect can be higher. That is, in FIGS. 6 and 7, the cusp field forming magnets are installed not only in the upper and lower surfaces but also in a direction vertical to the upper and lower surfaces. This is because in an area where there no wide and uniform external magnetic fields similar to an analysis magnetic field, a motion direction of electrons is arbitrary. In this case, when seen from the direction of ion beam, the cusp field surrounds the four surfaces of upper, lower, left and right sides to form a tunnel. Needless to say, in addition to the arrangement relation of the upper, lower, left and right sides, 4-surface cusp field forming magnets surrounding the beam line structure can be arranged by being rotated at optional angles around a center axis of ion beam.

Figure 10A:
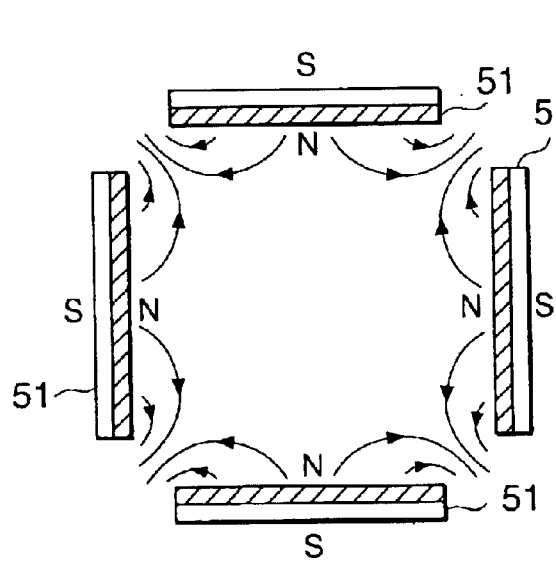
FIGS. 10A and 10B are explanatory views showing cusp fields according to a first example when magnets for forming cusp fields are arranged on 4 sides, i.e., upper, lower, left and right surfaces.
Figure 10B:
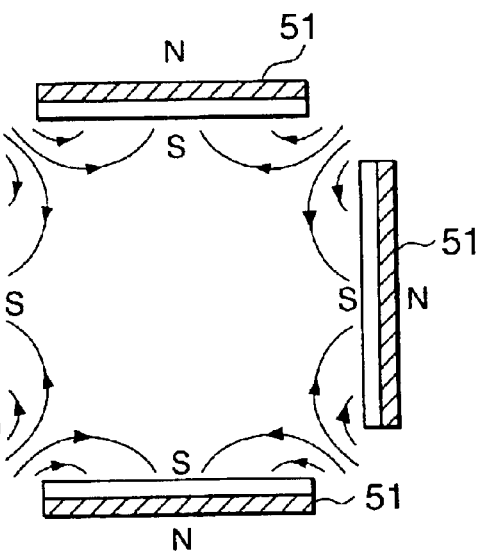
Figure 11:
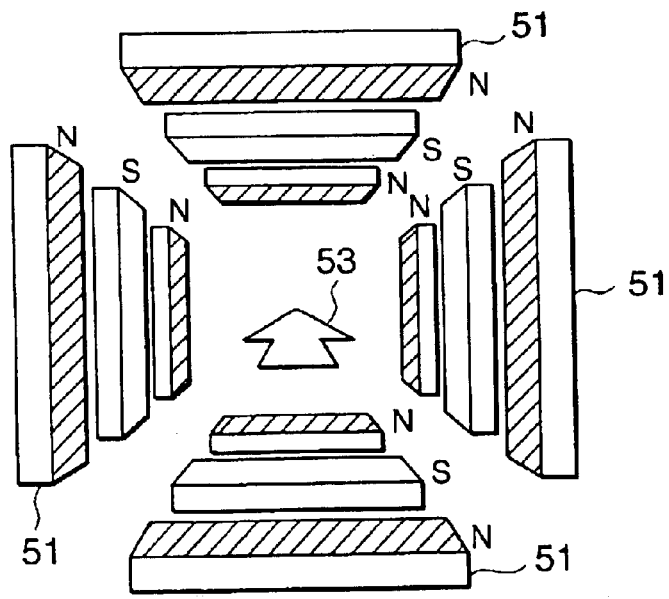
FIG. 11 is a view showing in perspective magnet arrangements of FIGS. 10A and 10B from a direction of ion beams.

To form a tunnel of such a cusp field, there are two patterns depending on polarity of a magnet. As shown in FIGS. 10A and 10B, a first is a pattern of alternately repeating, in a traveling direction of ion beam, arrangement where four sides, i.e., upper, lower, left and right surfaces surrounding a beam line, become N poles (FIG. 10A) of 4 permanent magnets 51, and arrangement where 4 surfaces become S poles (FIG. 10B) of 4 permanent magnets 51. When seen from the traveling direction of ion beam, the arrangements of FIGS. 10A and 10B are alternately repeated. In this case, perspective drawing of the arrangements in the same direction becomes similar to overall arrangement of FIG. 11. In each of all the upper, lower, left and right surfaces, N and S poles are alternately repeated in an ion beam traveling direction 53 to form the cusp field.

Figure 12A:
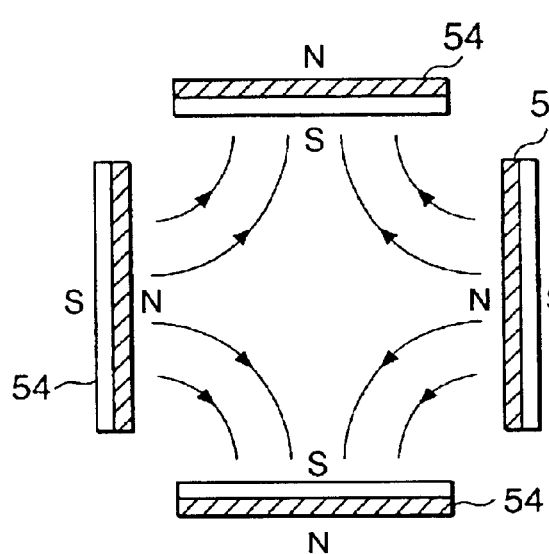
FIGS. 12A and 12B are explanatory views showing cusp fields according to a second example when magnets for forming cusp fields are arranged on 4 sides, i.e., upper, lower, left and right surfaces.
Figure 12B:
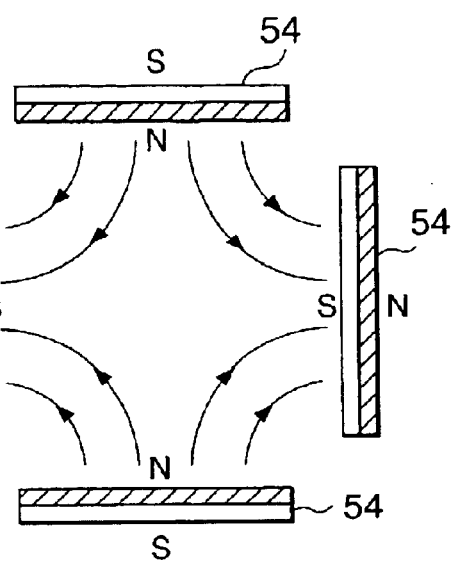
Figure 13:
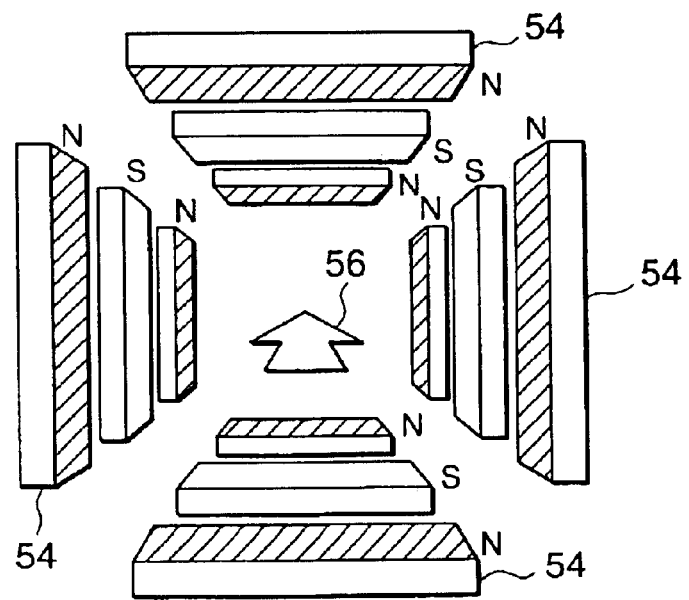
FIG. 13 is a view showing in perspective magnet arrangements of FIGS. 12A and 12B from a direction of ion beams.

A second is a pattern shown in FIGS. 12A and 12B. That is, this is a pattern of alternately repeating, in a traveling direction of ion beam, arrangement where N poles of two permanent magnets 54 oppose each other in upper and lower surfaces, and S poles of other 2 permanent magnets 54 oppose each other in left and right surfaces (FIG. 12B), and arrangement where S poles of 2 permanent magnets 54 opposite each other in upper and lower surfaces, and N poles of other 2 permanent magnets 54 oppose each other in left and right surface (FIG. 12A). When seen from the traveling direction of ion beam, the arrangements of FIGS. 12A and 12B are alternately repeated, and perspective drawing of the arrangements in the same direction becomes similar to overall arrangement of FIG. 13. Also in this case, in each of all the upper, lower, left and right surfaces, N and S poles are alternately repeated in an ion beam traveling direction 56 to form the cusp field. The second pattern is different from the first pattern in that roughly 4-pole magnets are formed in both of FIGS. 12A and 12B.

It is known that the 4-pole magnets operate to converge charged particles in a given plane, and simultaneously diffuse the charged particles in another plane. If such 4-pole magnets are arranged in a traveling direction of ion beam while being alternately reversed in polarity, the ion beam are alternately converged and diffused repeatedly to be transported efficiently.

If the cusp field forming magnets of the upper, lower, left and right surfaces are partially or all arranged in atmosphere, strength of the magnetic field is targeted to about 0.1 T (tesla) or higher on a vacuum side surface of the beam line vacuum chamber. To prevent from metal contamination, preferably, the cusp field forming magnet is fixed in the atmosphere where there is no danger of direct exposure to the ion beam. However, in order to apply the magnetic field of 0.1 T in the beam line vacuum chamber from the atmosphere side, considering a wall thickness of the beam line vacuum chamber, the magnetic field of several ten mT is further necessary on the surface of the cusp field forming magnet.

Assuming that the cusp field forming magnet is a permanent magnet, if a material of a residual magnetic flux density of around 1 T or higher at a normal temperature is used, required magnetic field strength can be obtained by a thickness of about several mm, whereby a degree of space freedom is increased. A specific example may be a material containing neodymium-iron-boron, or samarium-cobalt.

In place of the permanent magnet, an electromagnet can be used for the cusp field forming magnet. In this case, there is a problem of a great increase in size including additional power sources. However, this is an effective method, because arrangement similar to that of the permanent magnet is adopted to enable generation of a stronger magnetic field.

If the cusp field forming magnets of the upper, lower, left and right surfaces are partially or all installed in vacuum, permanent magnets are used as the cusp field forming magnets. In this case, each permanent magnet is fixed to the beam line vacuum chamber directly or by using a support member. When the support member is used, a structure may be formed to enable fixing of a plurality of permanent magnets to the support member while maintaining spacing therebetween. In this way, work efficiency of attaching/detaching with respect to the beam line vacuum chamber can be increased.

The permanent magnet is fixed to a direction for no direct exposure to ion beam, or in a state of being covered with a nonmagnetic cover. The nonmagnetic cover of the permanent magnet may be attached to the support member or integrated with the support member. This nonmagnetic cover can use graphite, silicon or the like where metal contamination is difficult to occur, and heat conduction is relatively good. Alternatively, as long as there are no problems of exposure to ion beam, a material such as aluminum which is easy to machining and good in heat conduction can be used. The nonmagnetic cover may be formed in a structure of 2 layers or more. In this case, for example, graphite, silicon or the like is used for a first layer on a surface, and aluminum or the like is used for a second layer.

There is a problem that the permanent magnet may be permanently demagnetized by heat. Thus, the cusp field forming magnet attached in the beam line vacuum chamber, and the support member including the cover are formed in a structure where heat conduction to the beam line vacuum chamber is increased to make a temperature increase difficult. For example, a structure may be adopted to better a contact state of the cusp field forming magnet and the support member including the cover with the beam line vacuum chamber, or enlarge a disconnection area of a contact part. For the support member including the cover, a material of heat conductivity of at least 100 W/mK or higher is used. There is also a method of actively removing heat around the permanent magnet by circulating cooling water through the structure.

Preferably, the permanent magnet contains samarium-cobalt which has a large residual magnetic flux density, and is relatively difficult to be permanently demagnetized by heat. As long as a temperature of the permanent magnet is always maintained at 60° C. or lower, a material containing neodymium-iron-boron may be used. For the permanent magnet, preferably, a residual magnetic flux density is 0.8 T or higher, and a coercive force at 60° C. is larger by 1.2 times or more than a product of the residual magnetic flux density and vacuum magnetic permeability.

In an area in which there is the magnetic field of the mass analysis magnet for deflecting ions, as specifically shown in FIG. 14A, even if there are no cusp field forming magnets, roughly parallel analysis magnetic fields 65 are present to deflect ions in a wide area between magnetic poles 61 of the mass analysis magnets. In this case, electrons moves in a spiral around a magnetic force line 67, and its guiding center path is extended a little to prolong a life. However, for the analysis magnetic field 65, magnetic field strength is substantially uniform to the magnetic poles 61 of the mass analysis magnets, and there are almost no functions of driving back the electrons. As a result, the electrons travel along the analysis magnetic field 65, and finally collide with the magnetic poles 61 of the mass analysis magnets to disappear.

In such an area between the magnetic poles 61, as shown in FIG. 14B, disappearance of the electrons can be prevented only by attaching a cusp field forming magnet 62 to each of upper and lower surfaces of the magnetic poles 61 of the mass analysis magnets. In the vicinity of the magnetic poles 61 of the mass analysis magnets, the analysis magnetic field is weakened as energy of ion beam is lower. Accordingly, the cusp field relatively becomes dominant to increase electron kicking-back efficiency.

On the other hand, in the vicinity of the ion orbit, since upper and lower cusp fields cancel each other, cusp fields can be ignored compared with analysis magnetic field strength necessary at the ion implantation system. Thus, ion beam are correctly deflected without being disturbed by any cusp fields. As energy of ion beam becomes high, a space charge effect is reduced to prevent from any reductions in transport efficiency of ion beam. Therefore, there are no problems at all even if cusp field effects are reduced.

A necessity of the cusp field forming magnet for confining the electrons in a vertical direction in the drawings is small. As described above, it is because between the magnetic poles in which there is an analysis magnetic field, running-away of the electrons is difficult in directions other than upper and lower directions.

The cusp field forming magnet attached between the magnetic poles of the mass analysis magnet unit is a permanent magnet. In practice, since the beam line vacuum chamber is held between the magnetic poles of the mass analysis magnet unit, the permanent magnet is arranged in a gap between the beam line vacuum chamber and the magnetic pole of the mass analysis magnet. Especially, the permanent magnet is fixed not to the beam line vacuum chamber side but to the magnetic pole side of the mass analysis magnet. It is because normally the place is in atmosphere and, when excitation of the mass analysis magnet unit is stopped to carry out maintenance work around the mass analysis magnet, the permanent magnet is maintained adsorbed on the magnetic poles of the mass analysis magnet made of iron, and thus a danger is small. For permanent magnet fixing, a nonmagnetic support member may be used.

The cusp field forming magnet is fixed to the mass analysis magnet side, and the cusp field forming magnet is fixed in the atmosphere simply because of good maintenance workability. Thus, essentially there are no differences in magnetic field structures even if a method of fixing the cusp field forming magnet to the beam line vacuum chamber side or in the beam line vacuum chamber is used.

For the permanent magnet, a material is selected, in which permanent demagnetization is difficult to occur even if a maximum magnetic field generated by the mass analysis magnet unit is applied reversely to the magnetic field of the permanent magnet. It is because, as shown in FIG. 14B, half of the permanent magnets in the space of the mass magnetic analysis magnet unit are exposed to the magnetic field of the mass analysis magnet of a direction opposite that of the magnetic field of each of the permanent magnets. Preferably, for each permanent magnet, a material is selected, which has a coercive force larger by about 1.2 times than a product of the maximum magnetic field of the mass analysis magnet and vacuum magnetic permeability, and in which permanent demagnetization is difficult to occur even in an opposite magnetic field. As an example, for a mass analysis magnet capable of applying the magnetic field of 1.2 T at the maximum, a material having a required coercive force of about 1100 kA/m or higher is preferred. At present, many of magnets containing neodymium-boron-iron have large coercive forces.

A cusp field forming magnet apparatus may be constituted of any one of a bar-shaped magnet, a roughly oblong cylindrical magnet, and a magnet combining a cylindrical magnet and a polygonal cylindrical magnet. Together with adoption of this cusp filed forming magnet, introduction of a very small amount of inactive gas such as argon, nitrogen or xenon, or molecular gas such as vapor into the beam line vacuum chamber enables simultaneous achievements of an increase in the number of generated electrons and life extension of the generated electrons, whereby a synergistic effect is obtained to further increase beam current.

Introduction of gas used in combination with the cusp field from the extraction electrode of the ion source to the mass analysis magnet is most effective for increasing beam current. This is for the following reason. That is, from the extraction electrode of the ion source to the mass analysis magnet unit, all ions including species other than the target ions extracted from the ion source are passed to contribute to a space charge effect, and thus diffusion of ion beam most strongly occurs.

In the foregoing, expressions of the upper, lower, left and right sides are used for convenience. However, relation among these upper, lower, left and right sides is not absolute relation, but relative relation.

The present invention can be applied not only to the above-described ion implantation system but also to a general ion implantation system. For example, the present invention can be applied to an ion implantation system which extracts ion beam from an ion source by an extraction electrode, analyzes mass by a mass analysis magnet unit and by a mass analysis slit, transports ions drifted or accelerates or decelerates ions after mass analysis, and implants ions in a semiconductor substrate. That is, the ion implantation system of the present invention can take the following forms.

1. A system configured in a manner that magnet apparatus for forming cusp fields is disposed in the above-described mass analysis magnet unit and the continuous beam line structure before and after the same.

2. A system configured in a manner that continuous cusp fields are formed in the beam line structure from the vicinity of the extraction electrode to the vicinity of an outlet of the mass analysis magnet unit.

3. A system configured in a manner that magnet apparatus for forming cusp fields is disposed in the beam line structure from the vicinity of the extraction electrode to an inlet of the mass analysis magnet unit.

4. A system configured in a manner that magnet apparatus for forming cusp fields is disposed in the beam line structure from the outlet of the mass analysis magnet unit to the vicinity of the mass analysis slit.

5. A system configured in a manner that magnet apparatus for forming cusp fields is disposed in the beam line structure from the vicinity of the mass analysis slit to the semiconductor substrate.

6. A system configured in a manner that continuous cusp fields are formed in the beam line structure from the vicinity of the inlet of the mass analysis magnet unit to the vicinity of the mass analysis slit.

7. A system configured in a manner that continuous cusp fields are formed in the beam line structure from the vicinity of the extraction electrode through the mass analysis magnet unit to the vicinity of the mass analysis slit.

8. A system configured in a manner that continuous cusp fields are formed in the beam line structure from the vicinity of the extraction electrode through the mass analysis magnet unit and the mass analysis slit to the vicinity of the semiconductor substrate.

The magnet apparatus for forming the cusp field is constituted to change magnetic field conditions in accordance with conditions of each section of the beam line structure, and realized in various forms similar to the following.

(1) The magnet apparatus for forming the cusp field is constituted of a plurality of magnets in which magnetic pole surfaces of the magnets facing an ion beam side are arrayed at given intervals along the beam line structure to alternately repeat N and S poles along the beam line structure.

(2) The magnet apparatus for forming the cusp field is constituted of a plurality of roughly square magnets, bar-shaped magnets or cylindrical magnets in which magnetic poles are arranged to face the beam line structure.

(3) The magnet apparatus for forming the cusp field is constituted of a plurality of magnets in which magnetic poles of the respective magnets are arranged to line up in a direction perpendicular to the beam line structure, and in a direction of the beam line structure.

(4) The magnet apparatus for forming the cusp field includes a plurality of magnets in which magnetic poles are placed oppositely to each other on 2 surfaces of a direction sandwiching an ion beam deflection surface.

(5) The magnet apparatus for forming the cusp field includes a plurality of magnets in which magnetic poles are placed oppositely to each other on totally 4 surfaces, i.e., 2 surfaces of a direction sandwiching an ion beam deflection surface, and 2 surfaces sandwiching ion beam in a direction orthogonal to the 2 surface of the direction sandwiching the ion beam deflection surface.

(6) Only the cusp field forming magnets in the mass analysis magnet unit are arranged on 2 surfaces to match the magnetic poles of the mass analysis magnet unit. The other cusp fields from the vicinity of the extraction electrode to the mass analysis magnet unit, from the mass analysis magnet unit to the mass analysis slit, and after the mass analysis slit may be arranged on 4 sides, i.e., upper, lower, left and right surfaces.

(7) The magnet for forming the cusp field is constituted, to cancel effects of the cusp fields on the beam line structure, in a manner that polarities of magnetic poles of ion beam facing sides of opposing magnets sandwiching the beam line structure coincide with each other, and magnetic field intensities of the opposing magnets are approximately equal to each other.

(8) The mass analysis magnet unit is roughly fan-shaped on plane. In this case, preferably, the cusp field forming magnet in the mass analysis magnet unit is constituted to gradually increase magnetic field strength from the inner diameter side to the outer diameter side of the mass analysis magnet unit in a magnetic field direction.

(9) Preferably, the cusp field forming magnets are arranged such that distances from ion beam to the respective magnets can be equal to each other.

(10) In a part where the beam line structure is surrounded with the cusp field forming magnets arranged on the 4 surfaces, the opposing cusp field forming magnets on the 4 surfaces are disposed such that polarities of the sides facing the ion beam can all be N poles or S poles, and these polarities can be alternately repeated while being reversed in an ion beam traveling direction.

(11) In a part where the beam line structure is surrounded with the cusp field forming magnets arranged on the 4 surfaces, the opposing cusp field forming magnets on the 4 surfaces may be disposed such that polarities of the sides facing the ion beam can become N poles on the upper and lower surfaces and S poles on the left and right surfaces, or S poles on the upper and lower surfaces and N poles on the left and right surfaces, and these polarities can be alternately repeated while being reversed in an ion beam traveling direction.

(12) A very small amount of inactive gas such as argon, nitrogen or xenon, or molecular gas such as vapor may be introduced into the space of the beam line structure on which the cusp field is applied. In this case, the introduction of the molecular gas is executed in the vicinity of the extraction electrode or in the space of the mass analysis magnet.

(13) A constitution may be adopted where the cusp field forming magnet is installed in the beam line vacuum chamber constituting the beam line structure, a detachable support member is disposed in an installation place in the beam line vacuum chamber, and the cusp field forming magnet is attached to the support member.

(14) A constitution may be adopted where the cusp field forming magnet is installed outside the beam line vacuum chamber constituting the beam line structure, a detachable support member is disposed in an installation place outside the beam line vacuum chamber, and the cusp field forming magnet is attached to the support member.

(15) The support member is structured to support the cusp field forming magnet in a direction for non-irradiation with ion beam or attach a cover to prevent from direct exposure of the cusp field forming magnet to ion beam.

(16) Preferably, the support member is made of a material having heat conductivity of 100 W/mK or higher to prevent from a temperature increase of the cusp field forming magnet, and efficiently conduct heat from the cusp field forming magnet to the beam line vacuum chamber.

(17) In order to prevent from the temperature increase of the cusp field forming magnet, the support member may be structured to circulate a coolant.

(18) A material of the support member is one of an aluminum alloy, graphite and silicon, and a material of the cover is also one of an aluminum alloy, graphite and silicon.

(19) For the cusp field forming magnet installed in the beam line vacuum chamber and in a position of a possible temperature increase by a heat load of ion beam, a permanent magnet is used, in which a coercive force at 60° C. is larger by 1.2 times or more than a product of a residual magnetic flux density and vacuum magnetic permeability.

(20) For the cusp field forming magnet, a permanent magnet containing samarium-cobalt can be used.

(21) The cusp field forming magnet arranged between the magnetic poles of the mass analysis magnet unit is fixed directly or indirectly through the support member to the magnetic poles of the mass analysis magnet unit to be installed in atmosphere.

(22) For the cusp field forming magnet arranged between the magnetic poles of the mass analysis magnet unit, preferably, a permanent magnet having a coercive force larger by 1.2 times or more than a product of a maximum analysis magnetic field and vacuum magnetic permeability is used.

(23) For the cusp field forming magnet, a permanent magnet containing neodymium-iron-boron can also be used.

(24) Each cusp field forming magnet may be constituted such that a magnetic pole width can be equal to/larger than a beam sectional width of ion beam.

As shown in FIG. 3, if the rear electrode 23 for acceleration or deceleration is provided, the following may be adopted. That is, a distance between a rear part of the mass analysis magnet unit 13 and the mass analysis slit 14 may be set longer by twice or more than that between the extraction electrode 12 and the front part of the mass analysis magnet unit 13, and a cusp transport space for converging ion beam out of the mass analysis magnet unit 13 may be disposed between the rear part of the mass analysis magnet unit 13 and the mass analysis slit 14. Alternatively, a distance between the rear part of the mass analysis magnet unit 13 and the mass analysis slit 14 may be set larger by twice or more than that between the extraction electrode 12 and the front part of the mass analysis magnet unit 13, and a distance from the mass analysis slit 14 through the rear electrode 23 to the semiconductor substrate 7 may be set shorter by half or less than that between the rear part of the mass analysis magnet unit 13 and the mass analysis slit 14.

According to the present invention, to form continuous cusp fields, not only in the range of magnetic pole surfaces of the mass analysis magnet but also outside the range of the magnetic pole surfaces of the mass analysis magnet, constitutions of cusp field forming magnets in the beam line vacuum chamber are considered. A magnetic pole surface 101 of a mass analysis magnet is, as shown in FIG. 6, a surface of the mass analysis magnet 43 facing an ion beam. Hereinafter, four embodiments are described by referring to FIGS. 15 to 18.

Figure 15:
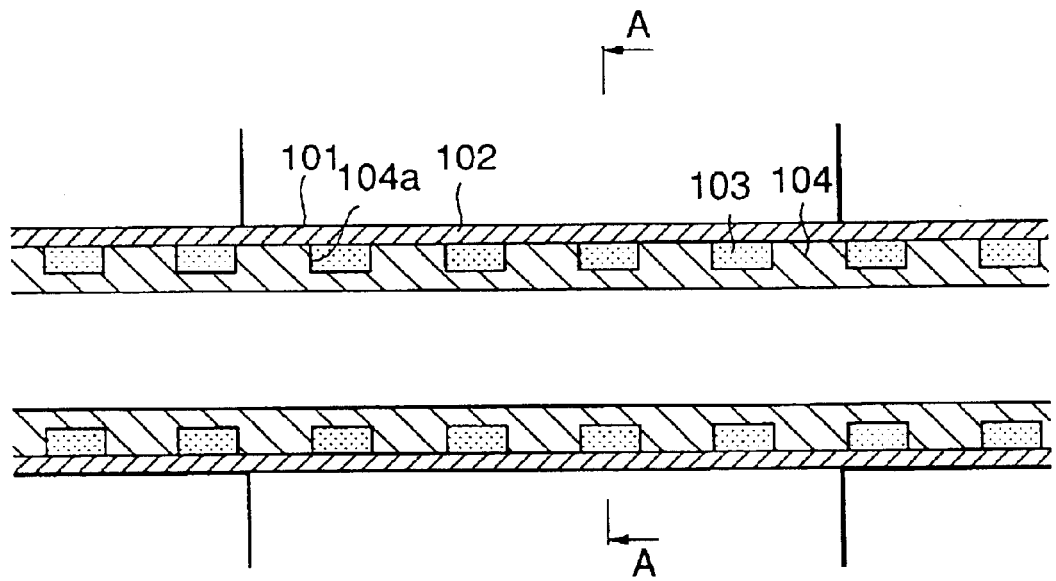
FIG. 15 is a sectional view showing arrangement of a mass analysis magnet and a magnet for forming a cusp field in the vicinity thereof according to a first embodiment of the present invention.

FIG. 15 shows a first embodiment. According to the first embodiment, a plurality of cusp field forming magnets 103 are arranged between a magnetic pole surface 101 of the mass analysis magnet and a beam line vacuum chamber 104. On the beam line vacuum chamber 104 outside the range of the magnetic pole surface 101 of the mass analysis magnet, cusp field forming magnets 103 continuous at fixed intervals are also arranged. Each cusp field forming magnet 103 is fixed to the beam line vacuum chamber 104.

In this case, in the beam line vacuum chamber 104, in order to increase cusp field strength in vacuum through which ion beam are passed, a concave 104a is formed to embed the cusp field forming magnet 103 on an outer surface of the beam line vacuum chamber 104. Accordingly, the cusp field forming magnet 103 can be arranged so as to close to the inside of the beam line vacuum chamber 104 as much as possible, i.e., to a vacuum side. To set the magnetic pole surface 101 of the mass analysis magnet and the beam line vacuum chamber 104 to different potentials, an insulating material 102 can be arranged between the magnetic pole surface 101 of the mass analysis magnet, the outside of the range of the magnetic pole surface 101 of the mass analysis magnet and the beam line vacuum chamber 104. In this case, the insulating material 102 is fixed to the magnetic pole surface 101 of the mass analysis magnet and the beam line vacuum chamber 104. As the insulating material 102, for example a nonmagnetic material such as a resin, a glass, a ceramic or a stone is used.

Figure 16:
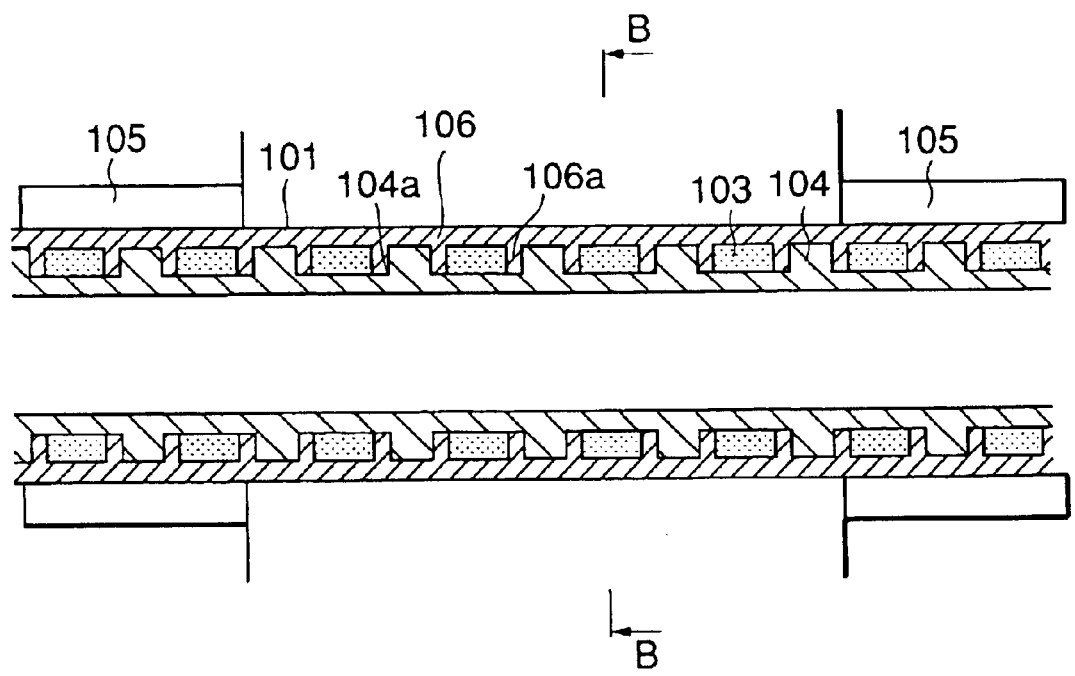
FIG. 16 is a sectional view showing arrangement of a mass analysis magnet and a magnet for forming a cusp field in the vicinity thereof according to a second embodiment of the present invention.

FIG. 16 shows a second embodiment. According to the second embodiment, a plurality of cusp field forming magnets 103 are also arranged between a magnetic pole surface 101 of a mass analysis magnet and a beam line vacuum chamber 104. In the embodiment, the cusp field forming magnet 103 is fixed to a first support member 106 having its housing part 106a. The first support member 106 is fixed to the magnetic pole surface 101 of the mass analysis magnet. On the beam line vacuum chamber 104 outside a range of the magnetic pole surface 101 of the mass analysis magnet, the following constitution is adopted to form continuous cusp fields at regular intervals.

A second support member 105 is fixed to the magnetic pole surface 101 of the mass analysis magnet, and an extended part of the first support member 106 to which the cusp field forming magnet 103 is fixed, is fixed to the second support member 105. In the beam line vacuum chamber 104, the following constitution is adopted to increase cusp field strength. A concave 104a is formed on outer surface of the beam line vacuum chamber 104 to embed the housing part 106a for the cusp field forming magnet 103.

Accordingly, the cusp field forming magnet 103 can be arranged so as to close to the inside of the beam line vacuum chamber 104 as much as possible, i.e., to a vacuum side. For the first support member 106, the above-described insulating material can be used to set the magnetic pole surface 101 of the mass analysis magnet, the second support member 105, and the beam line vacuum chamber 104 to different potentials.

Figure 17:
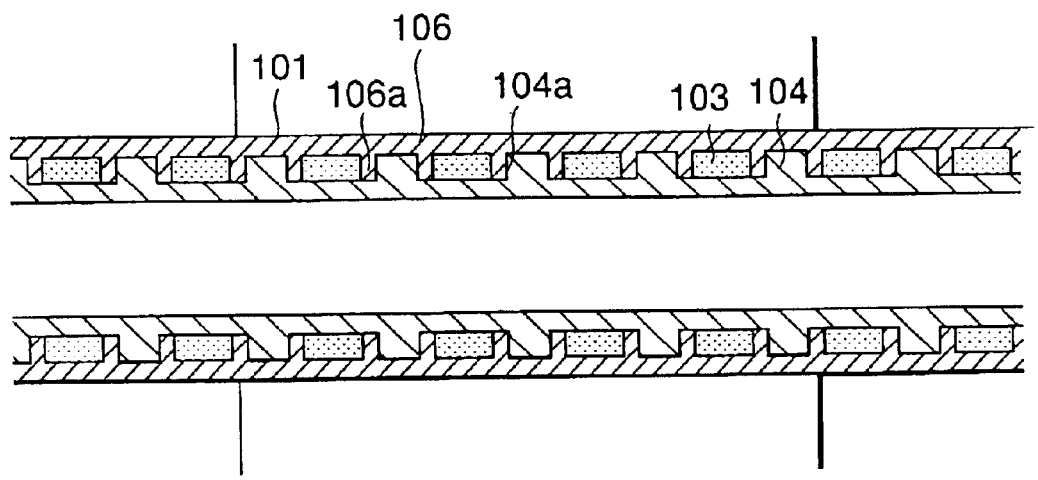
FIG. 17 is a sectional view showing arrangement of a mass analysis magnet and a magnet for forming a cusp field in the vicinity thereof according to a third embodiment of the present invention.

FIG. 17 shows a third embodiment. According to the embodiment, by using a first support member 106, a plurality of cusp field forming magnets 103 is arranged between a magnetic pole surface 101 of a mass analysis magnet and a beam line vacuum chamber 104. In the embodiment, on the beam line vacuum chamber 104 outside a range of the magnetic pole surface 101 of the mass analysis magnet, a cusp field forming magnet 103 continuous at regular intervals is arranged by an extended part of the first support member 106. That is, the cusp field forming magnet 103 is fixed to the first support member 106 having its housing part 106a. Also in this embodiment, in the beam line vacuum chamber 104, the following constitution is adopted to increase cusp field strength in vacuum through which ion beam is passed. A concave 104a is formed on an outer surface of the beam line vacuum chamber 104 to embed the housing part 106a for the cusp field forming magnet 103. Accordingly, the cusp field forming magnet 103 can be arranged so as to close to the inside of the beam line vacuum chamber 104 as much as possible, i.e., to a vacuum side. As in the case of the second embodiment, for the first support member 106, an insulating material can be used to set the magnetic pole surface 101 of the mass analysis magnet, and the beam line vacuum chamber 104 to different potentials.

Figure 18:
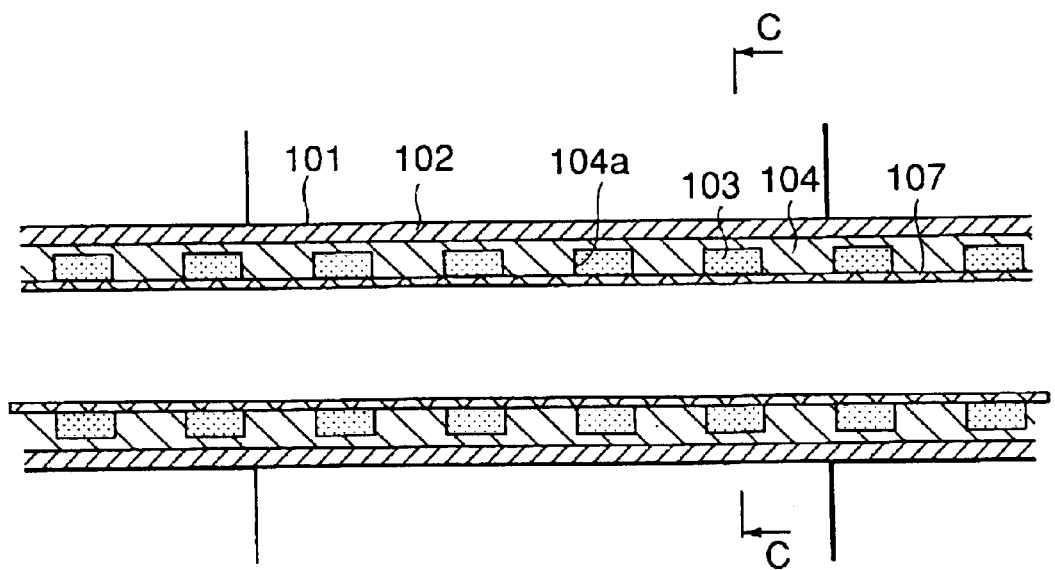
FIG. 18 is a sectional view showing arrangement of a mass analysis magnet and a magnet for forming a cusp field in the vicinity thereof according to a fourth embodiment of the present invention.

FIG. 18 shows a fourth embodiment. According to the embodiment, concaves 104a are formed in an inner surface side of a beam line vacuum chamber 104 to arrange a plurality of cusp field forming magnets 103. Also in this embodiment, on the beam line vacuum chamber 104 outside a range of a magnetic pole surface 101 of a mass analysis magnet, cusp field forming magnets 103 continuous at fixed intervals are arranged. Especially, in this structure, an area facing a vacuum side is covered with a cover 107. The cusp field forming magnet 103 is fixed to the beam line vacuum chamber 104 or the cover 107. The cover 107 is designed to prevent from direct exposure of the cusp field forming magnet 103 to ion beam. For the cover 107, a material containing Si, Al, Al (coated with Si), or a graphite/carbonaceous material is preferable. As in the case of the third embodiment of FIG. 17, in order to set the magnetic pole surface 101 of the mass analysis magnet and the beam line vacuum chamber 104 to different potentials, an insulating material 102 can be arranged between the magnetic pole surface 101 of the mass analysis magnet, the outside of a range of the magnetic pole surface 101 of the mass analysis magnet, and the beam line vacuum chamber 104. In this case, the insulating material 102 is fixed to the magnetic pole surface 101 of the mass analysis magnet, or outer surface of the beam line vacuum chamber 104.

Regarding the ion implantation system, common points of the first to fourth embodiments are as follows. That is, in the ion implantation system having the beam line vacuum chamber from an ion source to a wafer processing chamber, a beam line structure is formed to transport ion beam from the ion source through the beam line vacuum chamber into the wafer processing chamber. Then, a constitution is adopted where the mass analysis magnet unit is arranged from the outside in a partial section of the beam line vacuum chamber, and an effective magnetic field area of the mass analysis magnet is disposed in a partial section of the beam line structure. Further, in the continuous beam line vacuum chamber part of the beam line structure, the magnet apparatus is arranged to form continuous cusp magnetic fields for confining ion beam.

Alternatively, a beam line structure is formed to transport ion beam from an ion source through the beam line vacuum chamber into the wafer processing chamber, and a constitution is adopted where the mass analysis magnet is arranged from the outside in a partial section of the beam line chamber, and an effective magnetic field area of the mass analysis magnet is disposed in a partial section of the beam line structure. Then, in a part of the continuous beam line vacuum chamber of the beam line structure from the front part of the mass analysis magnet which becomes a beam line structure upstream side before the effective magnetic field area, through the effective magnetic field area of the magnetic pole surface in the mass analysis magnet to the rear part of the beam line structure outside the effective magnetic field area of the mass analysis magnet, the magnet apparatus is arranged to form continuous cusp fields for confining ion beam.

Further, concrete structural points are as follows. On an inner wall of the beam line vacuum chamber located in a section between the inner wall of the beam line vacuum chamber and the magnetic pole surface of the mass analysis magnet, a plurality of cusp field forming magnets are directly held continuously at regular intervals.

On an outer wall of the beam line vacuum chamber located in a section between the inner wall of the beam line vacuum chamber and the magnetic pole surface of the mass analysis magnet, a plurality of cusp field forming magnets are directly held continuously at regular intervals.

Inside the beam line vacuum chamber located in a section between the inner wall of the beam line vacuum chamber and the magnetic pole surface of the mass analysis magnet, a plurality of cusp field forming magnets are held continuously at regular intervals.

On an outer wall of the magnetic pole located in a section between the inner wall of the beam line vacuum chamber and the magnetic pole surface of the mass analysis magnet, a plurality of cusp field forming magnets are directly held continuously at regular intervals.

Inside the magnetic pole surface located in a section between the inner wall of the beam line vacuum chamber and the magnetic pole surface of the mass analysis magnet, a plurality of cusp field forming magnets are held continuously at regular intervals.

In the beam line vacuum chamber, a plurality of cusp field forming magnets are directly held continuously at regular intervals.

A structure is adopted where a concave is formed outside the beam line vacuum chamber to embed the cusp field forming magnet so that the cusp field forming magnet can be arranged so as to close to the inside of the beam line vacuum chamber, i.e., to the vacuum side.

A structure is adopted where the cusp field forming magnet is directly fitted to be fixed in a concave of the beam line vacuum chamber so that strength of the beam line chamber can be increased.

Now, describe from the standpoint of the beam line vacuum chamber in the ion implantation system.

In the beam line structure constituted in a manner that an effective magnetic field area of the mass analysis magnet is disposed in a partial section of the beam line vacuum chamber, and cusp field forming magnets are continuously arranged in the continuous beam line vacuum chamber from the front part of the effective magnetic field area of the mass analysis magnet through the effective magnetic field area of the mass analysis magnet to the rear part of the effective magnetic field area of the mass analysis magnet, a plurality of continuous cusp field forming magnets are fixed to be held on the magnetic pole surface side of the mass analysis magnet at regular intervals by a hold member (housing portion).

In the beam line vacuum chamber of the front and rear parts of the effective magnetic field area of the mass analysis magnet, a support member is attached to the magnetic pole surface of the mass analysis magnet to fix the hold member, and a plurality of continuous cusp field forming magnets are fixed to be held on the magnetic pole surface side of the mass analysis magnet and the hold member at regular intervals by the support member.

A structure is adopted where concaves are formed in the beam line vacuum chamber corresponding to the plurality of cusp filed forming magnets fixed to be held on the magnetic pole surface of the mass analysis magnet and the hold member at the regular intervals by the support member so that the cusp field forming magnets can be arranged so as to close to the inside of the beam line vacuum chamber, i.e., to the vacuum side.

A hold member or support member for fixing and holding the cusp field forming magnet between the magnetic pole surface of the mass analysis magnet and the beam line vacuum chamber uses an insulating material as fixing member so as to function as an insulator between the magnetic pole surface of the mass analysis magnet and the beam line vacuum chamber.

A plurality of continuous cusp field forming magnets are fixed to be held in the beam line vacuum chamber at regular intervals by a support member.

A structure is adopted where embedding concaves are formed in the beam line vacuum chamber to arrange the cusp field forming magnets so as to close to the inside of the beam line vacuum chamber, i.e., to the vacuum side.

A structure is adopted where embedding concaves are formed only in a necessary part of the beam line vacuum chamber to provide a part of no reductions in thickness so that a strength can be obtained to prevent from destruction by the atmospheric pressure.

The support member for fixing and holding the cusp field forming magnets arranged between the magnetic pole surface of the mass analysis magnet and the beam line vacuum chamber uses an insulating material to function as an insulator between the magnetic pole surface of the mass analysis magnet and the beam line vacuum chamber.

In the beam line vacuum chamber, a plurality of cusp field forming magnets continuous at regular intervals are fixed to be held.

The magnet cover is disposed to prevent from exposure of the cusp field forming magnet to ion beam. As described above, for the magnet cover, a material containing Si, Al, Al (coated with Si), or a graphite/carbonaceous material is preferable.

The cusp field forming magnets are fixed to be held directly in the beam line vacuum chamber or through the hold member.

A structure is adopted where concaves are formed in the wall of the beam line vacuum chamber to embed the cusp field forming magnets.

The cusp field forming magnets are fixed to be held in the beam line vacuum chamber through a cover holder.

A structure is adopted where concaves are formed in the vacuum side of the beam line chamber to embed the cusp field forming magnets so that the cusp field forming magnets can be arranged so as to close to the inside of the beam line vacuum chamber, i.e., to the vacuum side.

The wall surface of the beam line vacuum chamber is made thin to be able to obtain larger cusp field strength in the beam line vacuum chamber. However, if the whole wall of the beam line vacuum chamber is made thin, there is a danger of destroying the beam line vacuum chamber by the atmospheric pressure. Thus, concaves are formed only in the wall surface of the beam line vacuum chamber of a part where the cusp field forming magnets are arranged to make thin the wall of the beam line vacuum chamber. As a result, no reduction occurs in thickness of the wall of the beam line vacuum chamber other than the concave, whereby the beam line vacuum chamber has a structure to endure the atmospheric pressure.

In the case of the embodiment of FIG. 15, the cusp field forming magnet 103 is directly fixed in the concave 104*a* of the beam line vacuum chamber 104, whereby the cusp field forming magnet 103 can be considered as a part of the wall of the beam line vacuum chamber 104. Accordingly, mechanical strength can be obtained for the beam line vacuum chamber 104.

In the cases of the embodiments of FIGS. 16 and 17, the cusp field forming magnet 103 is fixed to the first support member 106. Thus, when the beam line vacuum chamber 104 is removed/attached, it can be individually handled without any effects of the presence of the cusp field magnet 103. In the cases of the embodiments of FIGS. 16 and 17, the first support member 106 functions as the insulator. Thus, the beam line vacuum chamber 104, the magnetic pole surface 101 of the mass analysis magnet, and the second support member attached to the magnetic pole surface 101 of the mass analysis magnet to be extended (in the case of FIG. 16) can be set to different potentials.

In the case of the embodiment of FIG. 18, the cusp field forming magnet 103 is directly arranged in the inner surface side of the beam line vacuum chamber 104. Thus, cusp field strength can be increased more.

FIGS. 19A to 19C, FIGS. 20 and 21, FIGS. 22A to 22C, and FIGS. 23A and 23B show partially modified examples of the embodiments from FIGS. 15 to 18. Concrete constitutions of a beam line vacuum chamber and its components, a cusp field forming magnet, a magnet support member, an insulating support member, a reinforcement member, and the like are shown in section. In FIGS. 19B and 19C, and FIGS. 22B and 22C, for convenience, only a part around one cusp field forming magnet is shown.

Figure 19A:
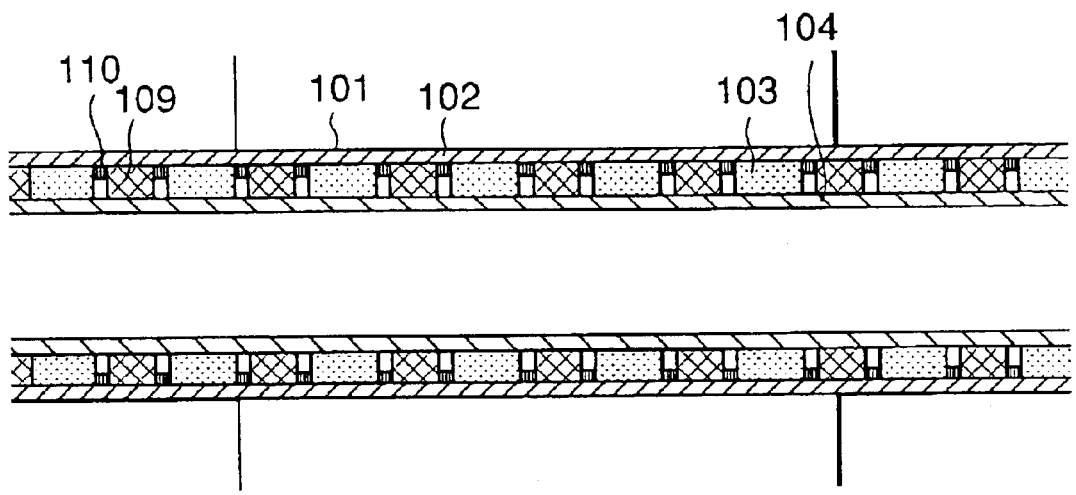
FIGS. 19A to 19C are sectional views showing three modified examples of the embodiment of FIG. 15.
Figure 19B:
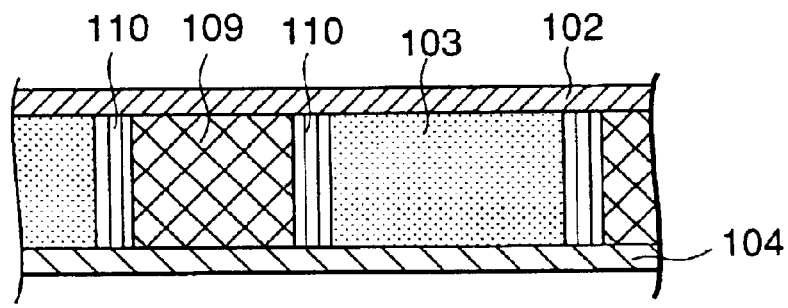
Figure 19C:
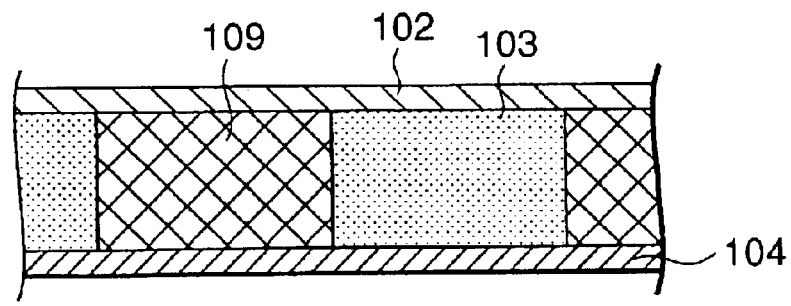

FIGS. 19A to 19C show modified examples of the embodiment of FIG. 15. In FIG. 19A, a convex (rib) between cusp field forming magnets 103 adjacent to each other in a beam line vacuum chamber 104, is removed, and cusp field forming magnets 103 are held at regular intervals between an insulating material 102 and the beam line vacuum chamber 104. In a space formed between the adjacent cusp field forming magnet 103, a reinforcement member 109 and a magnet fixing member 110 are arranged. In other words, the annular or square-cylindrical magnet fixing member 110 is fixed to the insulating material 102 to fix the cusp field forming magnet 103 therein, and the reinforcement member 109 is arranged between adjacent magnet fixing members 110. The magnet fixing member 110 is thinner than the cusp field forming magnet 103, while the reinforcement member 109 has a thickness equal to that of a space between the insulating material 102 and the beam line vacuum chamber 104.

In FIG. 19B, the thickness of the magnet fixing member 110 of FIG. 19A is set equal to that of the reinforcement member 109 so that no space is formed between the insulating material 102 and the beam line vacuum chamber 104.

In FIG. 19C, the magnet fixing member 110 of FIG. 19A is removed to fill the space between the adjacent cusp field forming magnets 103.

In FIGS. 19A to 19C, portions other than the above are similar to those of the embodiment of FIG. 15.

In the modified examples of FIGS. 19A to 19C, the beam line vacuum chamber 104 is thinner compared with that of the embodiment of FIG. 15, but mechanical strength is reinforced by the insulating material 102 and the reinforcement member 109. As a material for the reinforcement member 109, a strong and nonmagnetic material such as Al, a resin or a ceramic can be used.

Figure 20:
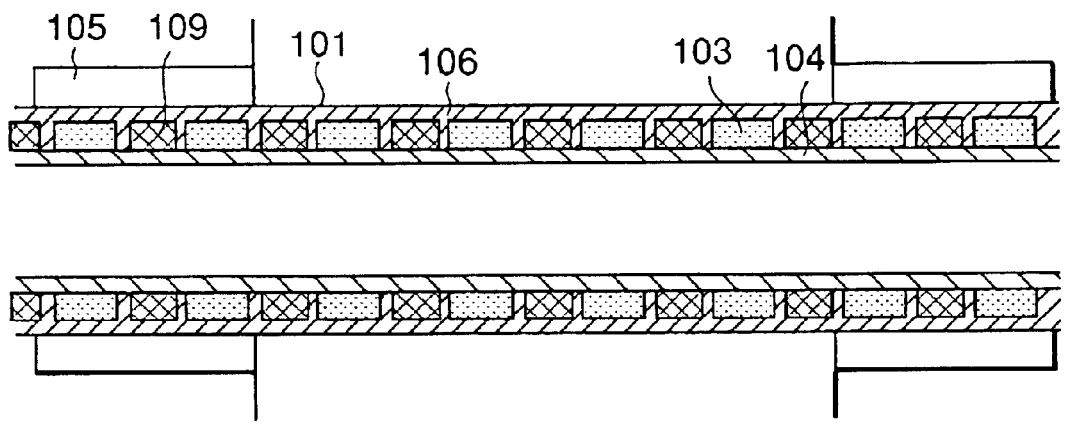
FIG. 20 is a sectional view showing a modified example of FIG. 16.

FIG. 20 shows a modified example of the embodiment of FIG. 16. According to this modified example, a convex (rib) between adjacent cusp field forming magnets 103 in a beam line vacuum chamber 104 is removed and, instead, the reinforcement member 109 described above with reference to FIGS. 19A to 19C is embedded. Other portions are similar to those of the embodiment of FIG. 16. Also in this modified example, the beam line vacuum chamber 104 is thinner compared with that of the embodiment of FIG. 16, but mechanical strength is reinforced by the first support member 106 and the reinforcement member 109.

Figure 21:
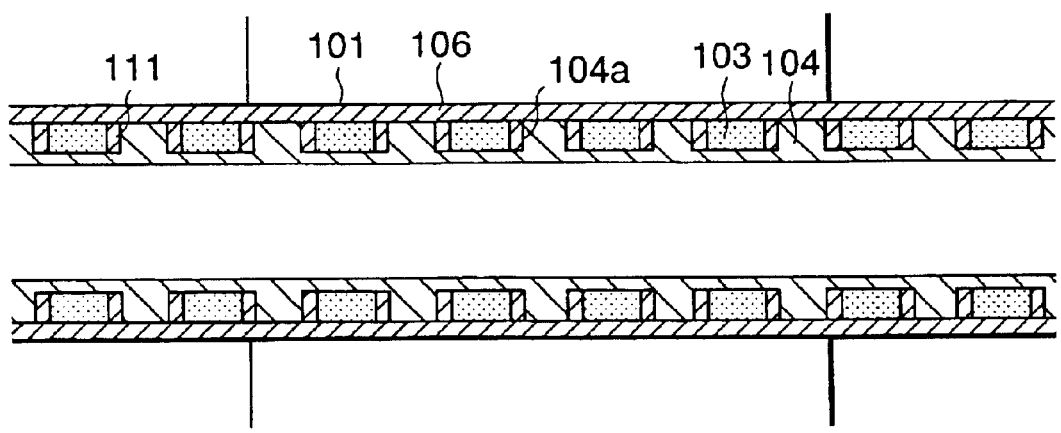
FIG. 21 is a sectional view showing a modified example of FIG. 17.

FIG. 21 shows a modified example of the embodiment of FIG. 17. In FIG. 17, the housing part 106*a* for the cusp field forming magnet 103 is integrated with the first support 106 member. However, according to this modified example, the cusp field forming magnet 103 is held by a filling member 111 which is a separate member to be embedded in the concave 104*a*. Other portions are similar to those of the embodiment of FIG. 17.

Figure 22A:
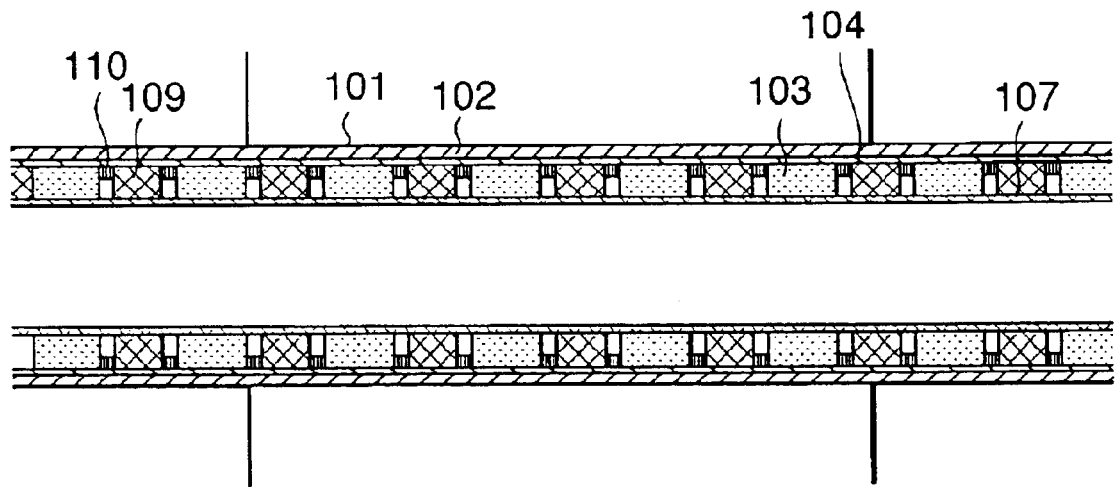
FIGS. 22A to 22C are sectional views showing other three modified examples combining the embodiment of FIG. 18 with the modified examples of FIGS. 19A to 19C.
Figure 22B:
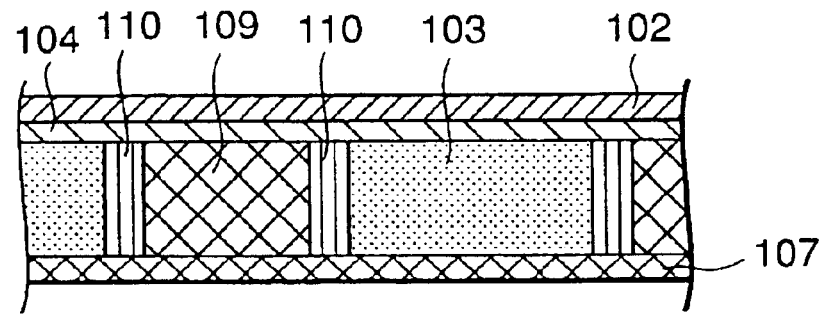
Figure 22C:
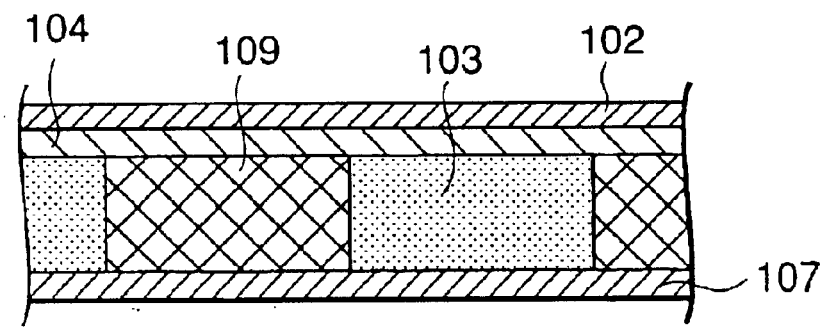

FIGS. 22A to 22C show modified examples combining the embodiment of FIG. 18 with the modified examples of FIGS. 19A to 19C. That is, the convex (rib) between the cusp field forming magnets 103 present in the inner surface side of the beam line vacuum chamber 104 in the embodiment of FIG. 18 is removed and, in a resulting space, a combination of the reinforcement member 109 and the magnet fixing member 110 described above with reference to FIGS. 19A to 19C, or only the reinforcement member 109 is arranged.

Specifically, FIG. 22A shows a modified example combining the embodiment of FIG. 18 with the modified example of FIG. 19A. That is, between the beam line vacuum chamber 104 and the cover 107, the cusp field forming magnets 103 held by the magnet fixing members 110 are arranged at fixed intervals, and a resulting space is filled with the reinforcement member 109. Since the thickness of the magnet fixing member 110 is smaller than the distance between the beam line vacuum chamber 104 and the cover 107, a small space is formed between the cusp field forming magnet 103 and the reinforcement member 109.

FIG. 22B shows a modified example combining the embodiment of FIG. 18 with the modified example of FIG. 19B. That is, the thickness of the magnet fixing member 110 is increased to fill the space present between the cusp field forming magnet 103 and the reinforcement member 109.

FIG. 22C shows a modified example combining the embodiment of FIG. 18 with the modified example of FIG. 19C. That is, a space between adjacent cusp field forming magnets 103 is filled with only the reinforcement member 109.

In FIGS. 22A to 22C, portions other than the above are similar to those of the embodiment of FIG. 18, or the modified examples of FIGS. 19A to 19C.

Figure 23A:
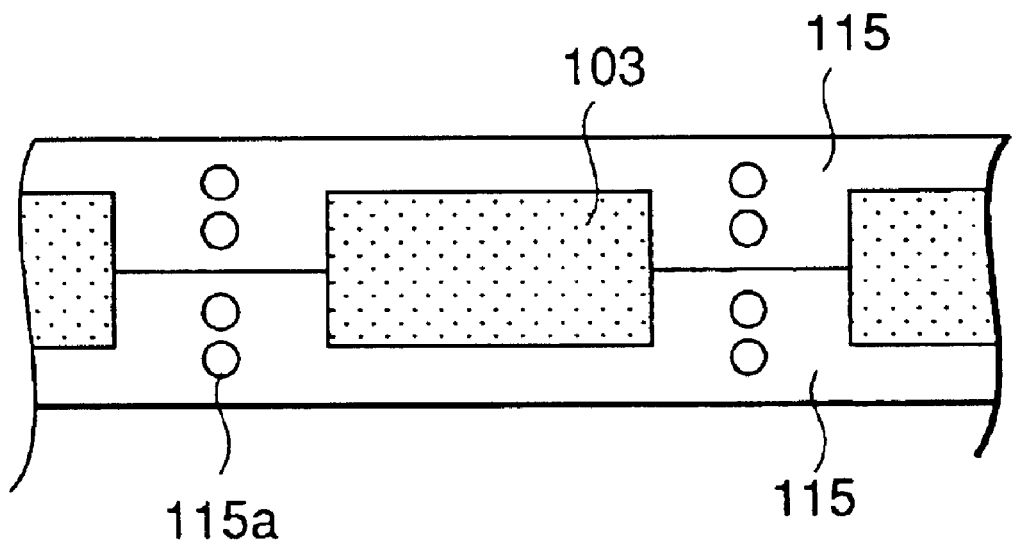
FIGS. 23A and 23B are sectional views showing two examples of fixing and holding structures of magnets for forming cusp fields according to the present invention.
Figure 23B:
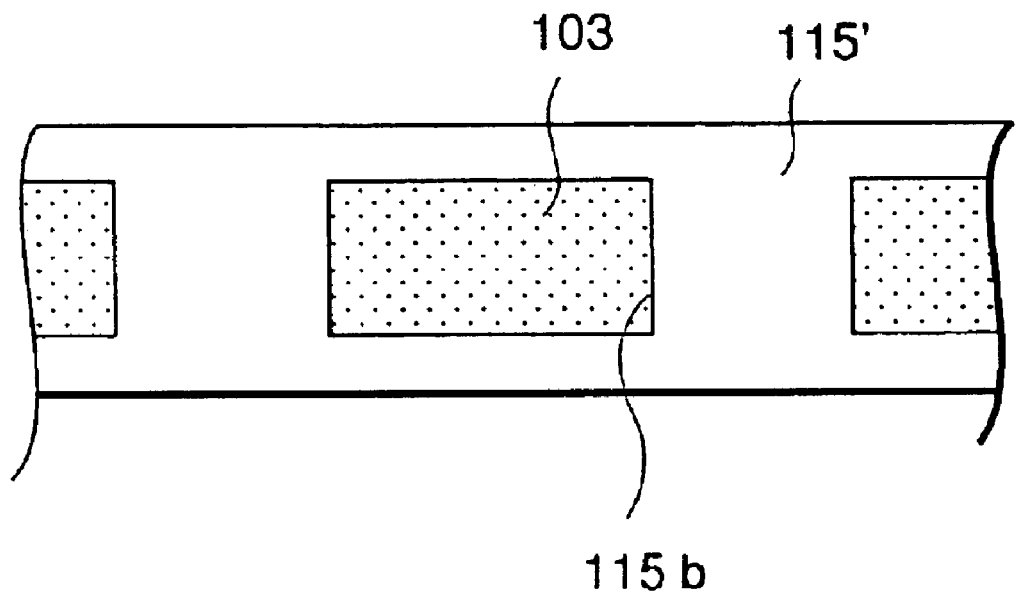

FIGS. 23A and 23B show embodiments of fixing methods of cusp field forming magnets 103 regarding a portion around one cusp field forming magnet 103. FIG. 23A shows an example where a material similar to the above-described first support member 106 or reinforcement member 109, and the cusp field forming magnet 103 is held between two intermediate members 115 of a division type. Each intermediate member 115 has concaves for embedding the cusp field forming magnets 103 at regular intervals. The cusp field forming magnets 103 are housed in these concaves. Preferably, waste holes 115a are formed in the intermediate member 115 to reduce weight.

In an example of FIG. 23B, a material similar to the above-described first support member 106 or reinforcement member 109 is used, and a hole 115b is formed in an intermediate member 115' to fit the cusp field forming magnet 103 therein. The cusp field forming magnet 103 is fitted in this hole 115' and is fixed. Needless to say, waste holes may be formed to reduce weight.

In both examples of FIGS. 23A and 23B, the intermediate members 115 and 115' may be walls themselves of the beam line vacuum chamber 104. In such a case, as described above, members similar to the insulating material 102, the first support member 106 and the like may be combined for reinforcement in outer or inner sides of the intermediate members 115 and 115'.

Figure 24A:
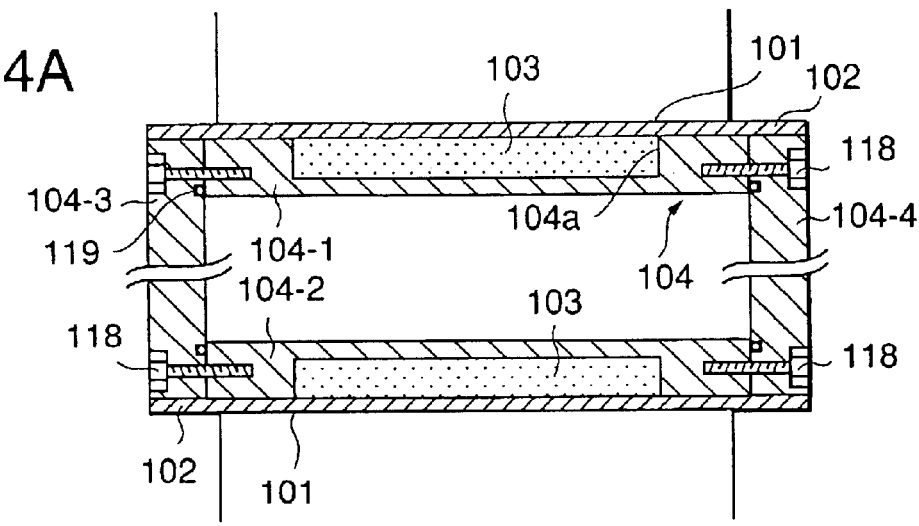
FIGS. 24A to 24C are sectional views cut along the line A—A of FIG. 15, showing three examples of a structure of a beam line vacuum chamber of the present invention applied to the embodiment of FIG. 15.
Figure 24B:
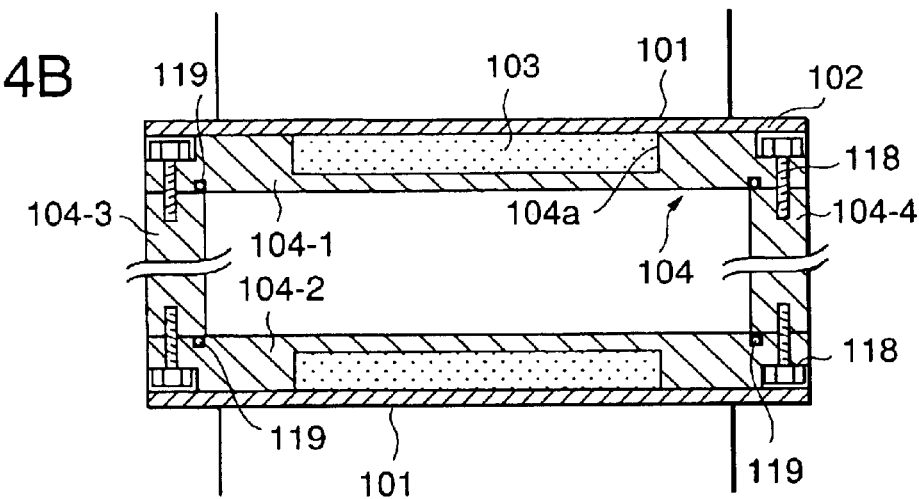
Figure 24C:
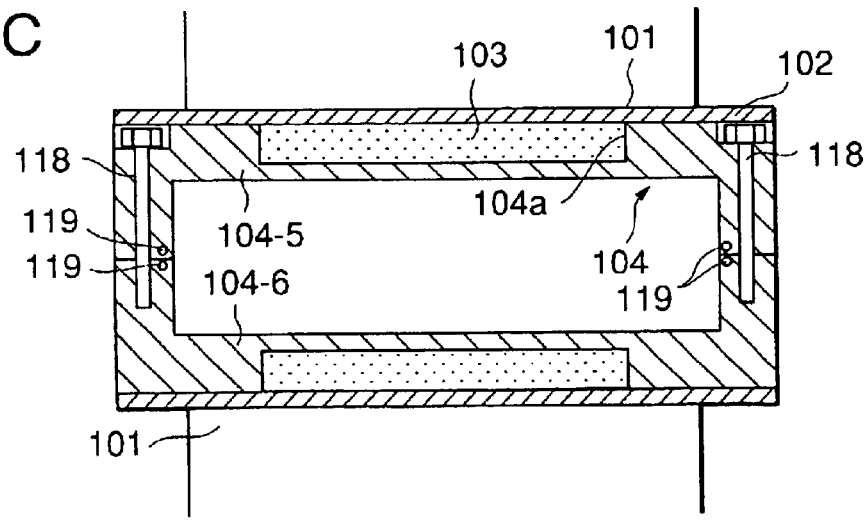

FIGS. 24A to 24C are sectional views cut along the line A—A of FIG. 15. In an example of FIG. 24A, the beam line vacuum chamber 104 is constituted by fixing side wall members 104-3 and 104-4 to both sides of upper and lower wall members 104-1 and 104-2 by bolts 118. A sealing member 119 is disposed in a joined part thereof to maintain vacuum.

In an example of FIG. 24B, the beam line vacuum chamber 104 is constituted by fitting the side wall members 104-3 and 104-4 in the inner sides of both ends of the upper and lower wall members 104-1 and 104-2 and by fixing by the bolts 118. The sealing member 119 is disposed in a joined part thereof to maintain vacuum. In this example, head portions of the bolts 118 are embedded in the upper and lower wall members 104-1 and 104-2 to mount the insulating material 102. However, the bolts 118 may be inserted from an upper side of the insulating material 102.

In an example of FIG. 24C, the beam line vacuum chamber 104 is an upper and lower 2-division type constituted of upper and lower wall members 104-5 and 104-6, and these members are fastened to be fixed by the bolts 118. In all of FIGS. 24A to 24C, the insulating material 102 is fixed to the beam line vacuum chamber 104 by bolts or the like.

Figure 25:
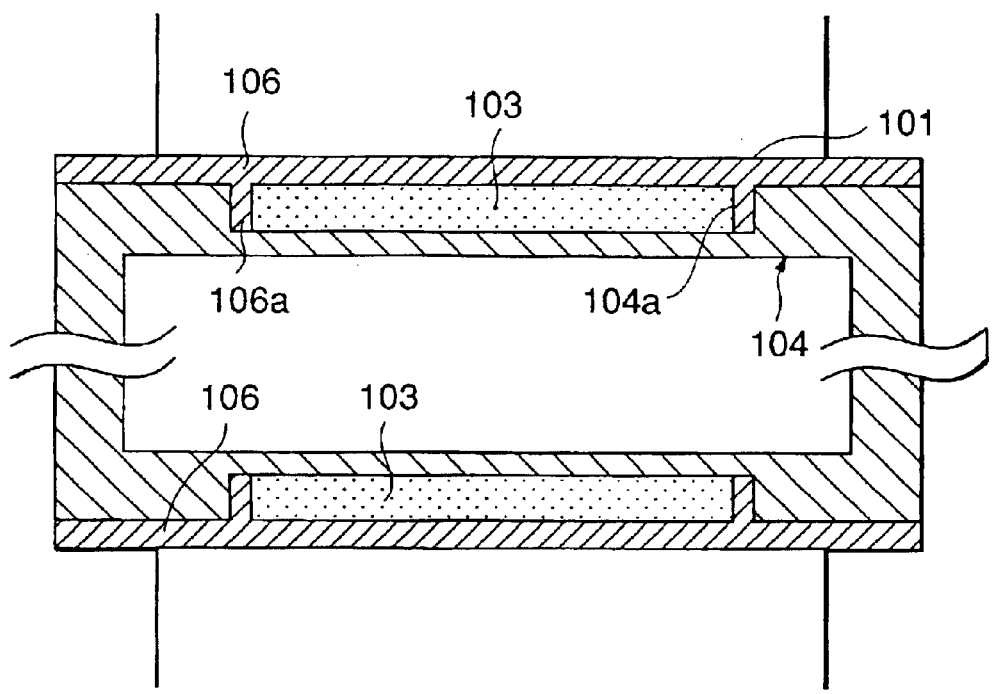
FIG. 25 is a sectional view cut along the line B—B of FIG. 16.

FIG. 25 is a sectional view cut along the line B—B of FIG. 16. Although not shown, the beam line vacuum chamber 104 is realized by a structure similar to that of each of FIGS. 24A to 24C. In FIG. 25, the first support member 106 is fixed to the beam line vacuum chamber 104 by bolts or the like.

Figure 26:
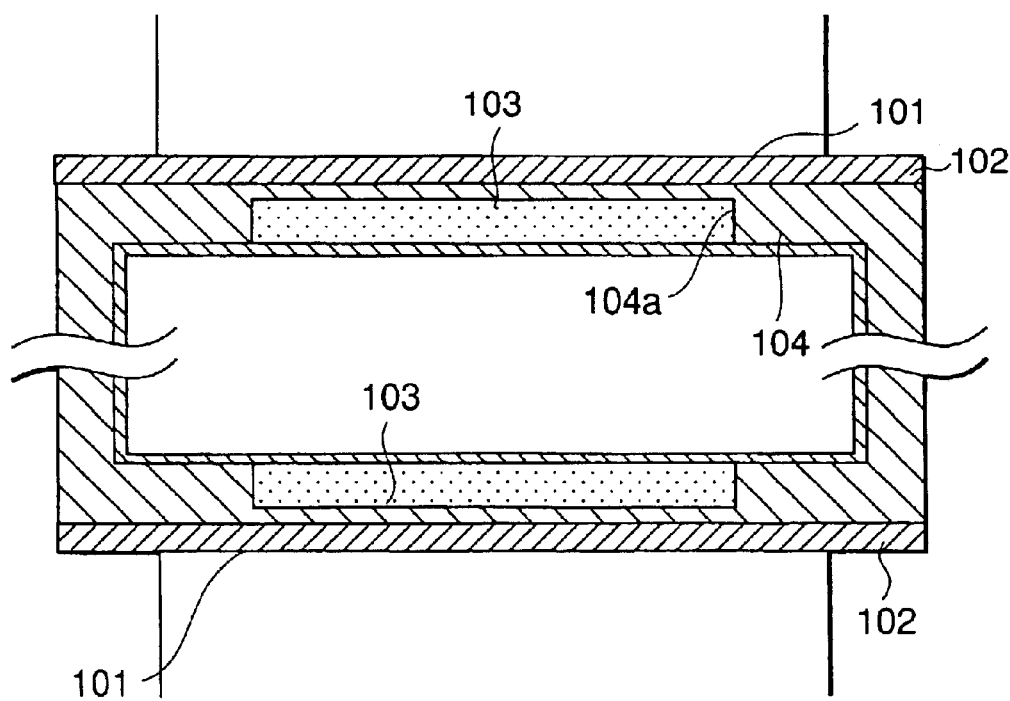
FIG. 26 is a sectional view cut along the line C—C of FIG. 18.

FIG. 26 is a sectional view cut along the line C—C of FIG. 18.

Figure 27:
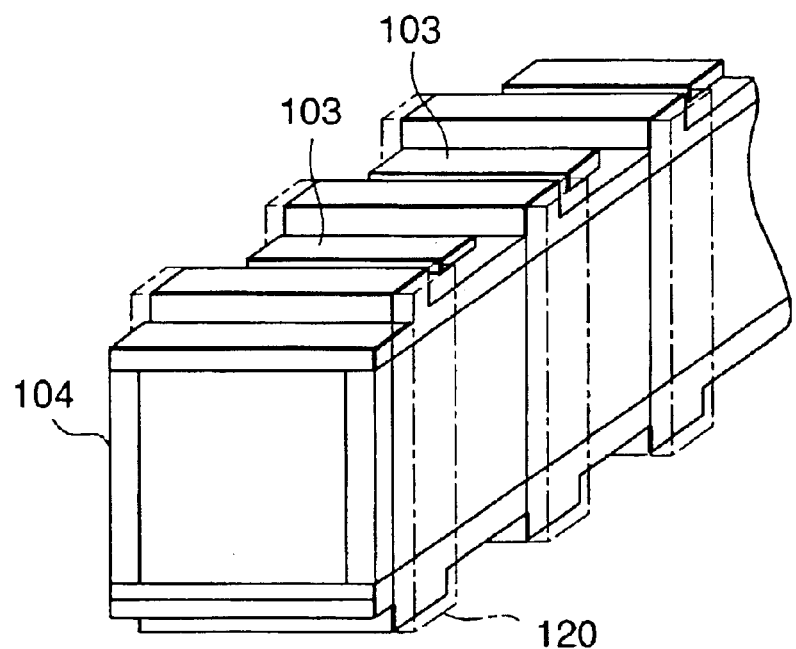
FIG. 27 is a perspective view showing yet another example of a fixing and holding structure of a magnet for forming a cusp field, which is combined with a beam line vacuum chamber.

FIG. 27 shows yet another example of a fixing structure of the cusp field forming magnet 103. This example may be a modified example of the embodiment shown in FIG. 17. That is, concaves are formed at regular intervals on an outer surface side of the beam line vacuum chamber 104 to arrange the cusp field forming magnets 103 therein. However, without using the first support member 106 of FIG. 17, the cusp field forming magnets 103 are fixed in the concaves of the beam line vacuum chamber 104 by a plurality of pins or the like. A space is formed between the cusp field forming magnet 103 and a rib, but nothing is disposed in this space. To increase mechanical strength of the beam line vacuum chamber 104, as indicated by a chain line, reinforcing plates 120 may be attached in parts corresponding to upper and lower ribs to left and right side walls of the beam line vacuum chamber 104. Also in this example, the beam line vacuum chamber 104 is realized by a structure similar to that of each of FIGS. 24A to 24C.

Figure 28:
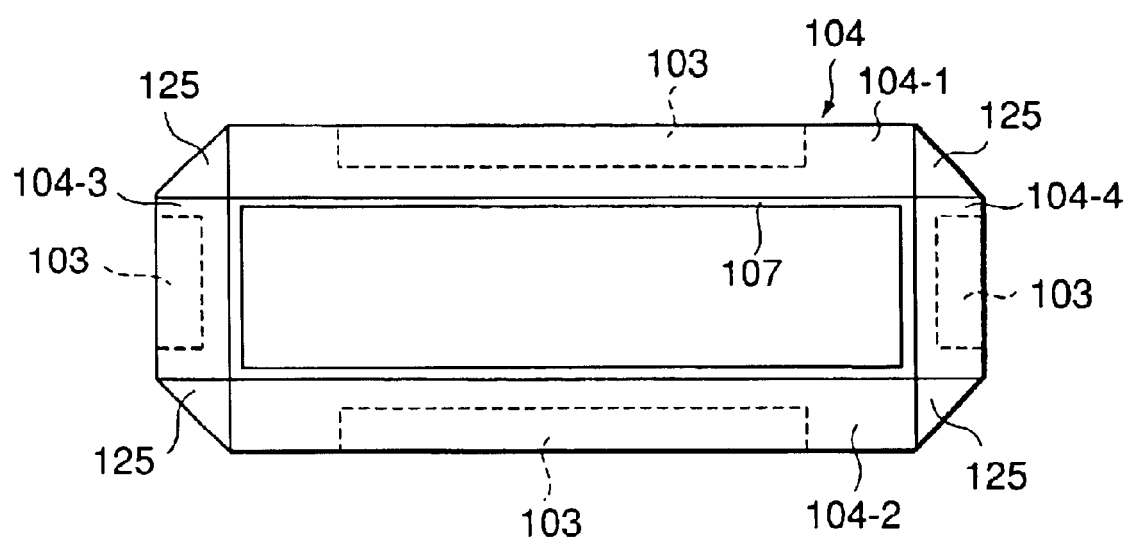
FIG. 28 is a sectional view showing yet another example of arrangement of a magnet for forming a cusp field, which is combined with a beam line vacuum chamber of the present invention.

FIG. 28 shows yet another example of arrangement of the cusp field forming magnet 103, and a structure of the beam line vacuum chamber 104. In this example, the beam line vacuum chamber 104 is constituted of upper and lower wall members 104-1 and 104-2, and left and right side wall members 104-3 and 104-4, and these members are connected at 4 corners by reinforcement members 125. The cover 107 is disposed in an inner surface side of the beam line vacuum chamber 104. In this example, especially the cusp field forming magnets 103 are embedded not only in the upper and lower wall members 104-1 and 104-2, but also in the left and right side wall members 104-3 and 104-4.

Needless to say, the arrangement of embedding the cusp field forming magnets 103 in the left and right side wall members 104-3 and 104-4 of the beam line vacuum chamber 104 can be applied to all the previous examples. The cusp field forming magnet 103 is embedded from the outer surface side of the beam line vacuum chamber 104. Needless to say, however, the cusp field forming magnet may be embedded from the inner surface side of the beam line vacuum chamber 104 as described above.

Figure 29:
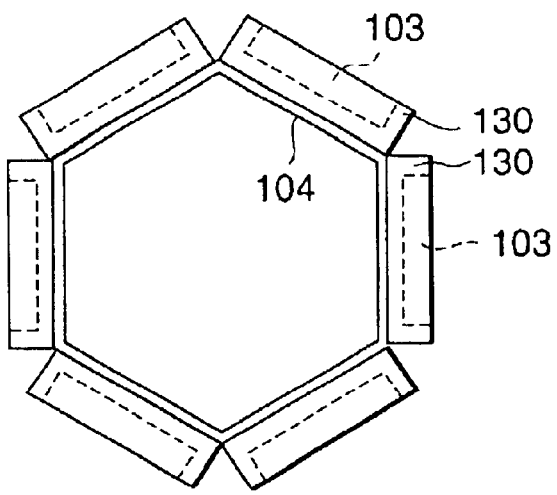
FIG. 29 is a front view showing another structure example of a beam line vacuum chamber of the present invention, and an arrangement example of a magnet for forming a cusp field, which is combined with the beam line chamber.

FIG. 29 shows yet another example of arrangement of the cusp field forming magnet 103, and a structure of a beam line vacuum chamber 104. In this example, the beam line vacuum chamber 104 is polygonal or hexagonal in section, and the cusp field forming magnet 103 is arranged in each of 6 outer surfaces thereof. To fix and hold the cusp field forming magnet 103, a support member 130 made of a material similar to that of the first support member 106 is used. This support member 130 is a plate member having concaves at regular intervals in a longitudinal direction to embed the cusp field forming magnets 103, and fixed to the beam line vacuum chamber 104 by bolts or the like. Also in this example, the cusp field forming magnet 103 is embedded from the inner surface side of the support member 130. Needless to say, however, the cusp field forming magnet 103 may be embedded from the other surface side of the support member 130. Alternatively, as in the case of the example of FIG. 27, an entire shape of the beam line vacuum chamber 104 may be formed similar to that of FIG. 29, and the cusp field forming magnet 103 may be embedded from the inner or outer surface side thereof. In the case of embedding from the inner surface side, it must be covered with a cover similar to the above-described cover 107.

Figure 30A:
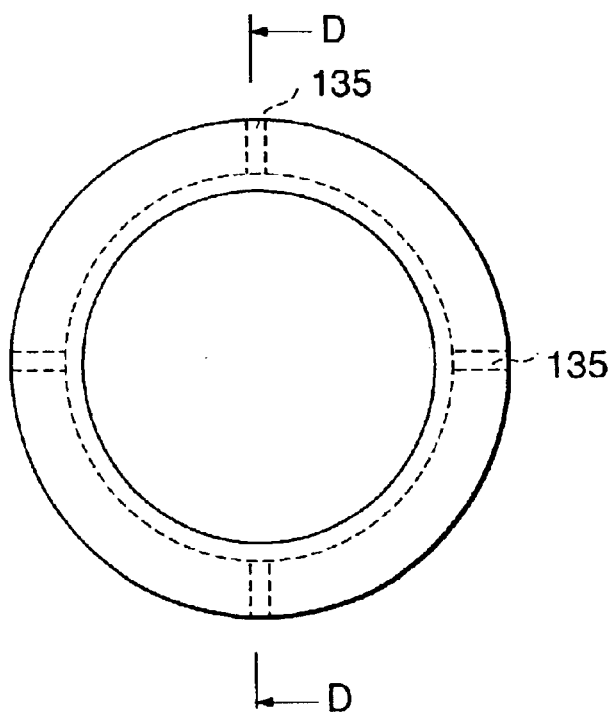
FIGS. 30A and 30B are a front view, and a sectional view cut along the line D—D showing yet another structure example of a beam line vacuum chamber of the present invention, and an arrangement example of a magnet for forming a cusp field, which is combined with the beam line vacuum chamber.
Figure 30B:
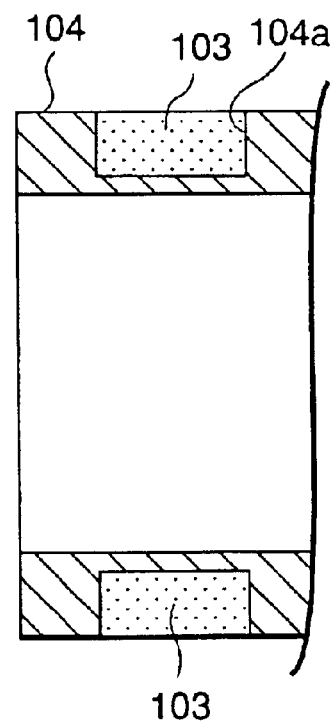

FIGS. 30A and 30B show yet another example of arrangement of the cusp field forming magnet 103, and a structure of the beam line vacuum chamber 104. In this example, the beam line vacuum chamber 104 has a cylindrical shape which is circular in section, and its outer peripheral side is divided into 4 sections to arrange circular-arc cusp field forming magnets 103. That is, in the cylindrical beam line vacuum chamber 104, with respect to a longitudinal direction, concaves 104a are formed at fixed intervals in a circumferential direction to embed the circular-arc cusp field forming magnets 103. A thick part between adjacent concaves becomes a rib. Needless to say, magnetic poles of the cusp field forming magnet 103 are magnetized in directions similar to those of the above-described examples to become an N or S pole toward the inside of the beam line vacuum chamber 104, and an S or N pole toward the outside. A spacer 135 is disposed between adjacent cusp field forming magnets 103 in the circumferential direction. The cusp field forming magnet 103 can be embedded from the inner surface side of the beam line vacuum chamber 104. In such a case, however, the inner surface side must be covered with a cover similar to that of FIG. 18. The beam line vacuum chamber 104 may be constituted of only a shown thick part, and a part corresponding to a rib part may be constituted of a ring member made of a material similar to that of the above-described reinforcement member 109.

In any case, according to the magnet arrangements shown in FIGS. 28 to 30A, and 30B, cusp field strength in the beam line can be increased.

Common points in the constitutions of FIGS. 24A to 24C, to FIGS. 30A and 30B in the case of the ion implantation system are as follows. In the ion implantation system having the beam line vacuum chamber from the ion source to the wafer processing chamber, the beam line structure is formed to transport ion beam from the ion source through the beam line vacuum chamber into the wafer processing chamber, a section of the beam line vacuum chamber constituting the beam line structure perpendicular to the ion beam is tubular, which becomes polygonal or circular, the inner side wall of the beam line vacuum chamber which becomes tubular is made thin in a partial or all sections of the beam line vacuum chamber constituting the beam line structure, and the reinforcing member is arranged outside the inner side wall.

Alternatively, the beam line structure is formed to transport ion beam from the ion source through the beam line vacuum chamber into the wafer processing chamber, a section of the beam line vacuum chamber constituting the beam line structure perpendicular to the ion beam is tubular, which becomes polygonal or circular, the outer side wall of the beam line vacuum chamber which becomes tubular is made thin in a partial or all sections of the beam line vacuum chamber constituting the beam line structure, and the reinforcing member and the inner wall member are arranged inside the outer side wall.

Further, concrete structural points are as follows. A partial section of the beam line vacuum chamber constituting the beam line structure includes a section of the mass analysis magnet unit arranged in the position near the ion source of the beam line vacuum chamber constituting the beam line structure.

The reinforcing members are arranged at regular intervals.

The continuous cusp field forming magnets are arranged as reinforcing members at regular intervals.

Alternatively, the reinforcing members and the cusp field forming magnets are alternately arranged at regular intervals.

In accordance with the shape of the tubular beam line vacuum chamber which becomes polygonal or circular, the reinforcing members and the cusp field forming magnets are alternately arranged at regular intervals, or in at least a group of opposing locations of the tubular beam line vacuum chamber which becomes polygonal or circular.

The reinforcing members are arranged as reinforcing ribs at proper intervals in a direction perpendicular to the ion beam. Needless to say, such reinforcing members may be arranged as reinforcing ribs at proper intervals in the same direction of the ion beam or in an oblique direction.

The reinforcing members and the continuous cusp field magnets are alternately arranged closely.

The inner side or outer side wall of the beam line vacuum chamber constituted to become thin is made thin in a part of no reinforcing members in accordance with the shape of the tubular beam line vacuum chamber which becomes polygonal or circular.

Figure 31:
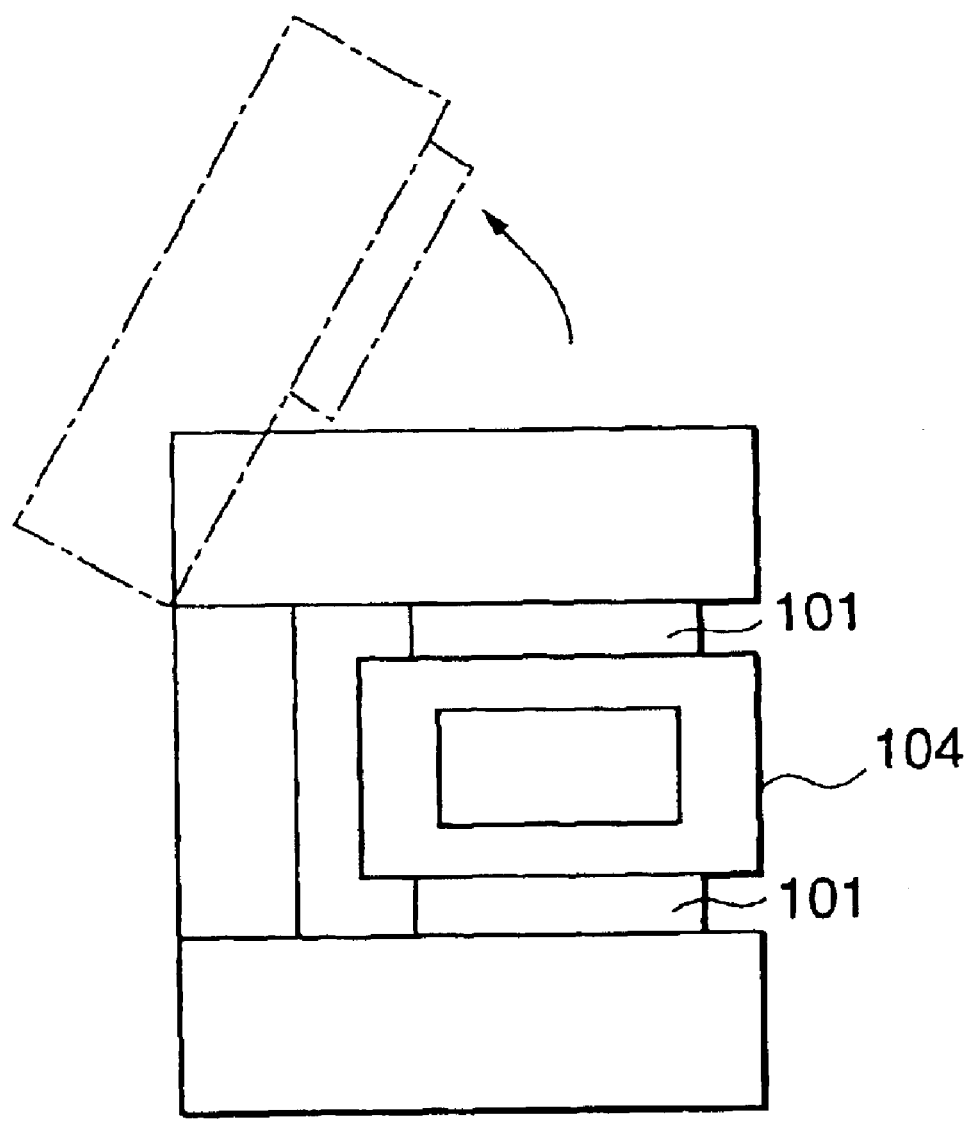
FIG. 31 is a front view schematically showing a structure where components of a mass analysis magnet are partially detachable according to the present invention.

FIG. 31 shows an example where a component constituting one magnetic pole surface of the mass analysis magnet unit is partially detachably constituted to be widened in spacing with respect to a component of the other magnetic pole surface. That is, the component of one magnetic pole surface of the mass analysis magnet unit is freely rotated by means such as a hinge. Here, only the beam line vacuum chamber 104 is schematically shown, and the cusp field forming magnet similar to the foregoing is omitted.

That is, in this example applied to the case of the ion implantation system, a beam line structure is formed from the front part of the mass analysis magnet unit through the mass analysis magnet unit to the rear part of the mass analysis magnet unit to subject ions extracted from the ion source by the extraction electrode to mass analysis at the mass analysis magnet unit and the mass analysis slit, and transport the ions drifted or accelerated/decelerated to implant the ions in the semiconductor substrate, and one magnetic pole surface side of the mass analysis magnet unit is partially detachably constituted to be widened in spacing with respect to the other magnetic pole surface side.

According to the present invention, in the ion implantation system for subjecting ions extracted from the ion source by the extraction electrode to mass analysis at the mass analysis magnet unit and the mass analysis slit, and transport the ions drifted or accelerated/decelerated to implant the ions in the semiconductor substrate, the cusp fields are disposed in the proper places along the beam line to the semiconductor substrate, whereby a density of electrons or negative ions present in the vicinity of the beam line can be increased. Moreover, the cusp fields are disposed to enable presence of many negative charged particles, whereby repel of positive charges of ion beam, i.e., a space charge effect, is mitigated.

As a result, since enlargement and losses of ion beam are prevented, an ion beam current can be greatly increased. This effect is particularly conspicuous in ion beam of low energy on which a space charge effect is strongly applied, and therefore it is possible to obtain an excellent low-energy ion implantation system.

By using the beam line vacuum chamber, the cusp field forming magnet can be accurately positioned and fixed with respect to ion beam, and attaching/detaching, and arranging/assembling work can be simplified.

By using the holder or the support member for fixing and holding the cusp field forming magnet arranged between the magnetic pole surface of the mass analysis magnet and the beam line vacuum chamber, and the insulating material as the fixing member, the insulator function can be provided between the magnetic pole surface of the mass analysis magnet and the beam line vacuum chamber, whereby an optional potential can be set to maintain an independent potential.

Even when the beam line vacuum chamber is made thin, the thickness of the chamber can be obtained by the magnet, the reinforcing member, and the like, whereby a structure having strength to prevent from destruction by the atmospheric pressure can be formed.

The concave is disposed or bored only in the necessary part of the beam line vacuum chamber to embed the magnet, and a part of no reduction in thickness is formed in the wall of the beam line vacuum chamber, whereby a structure having strength to prevent from destruction by the atmospheric pressure can be formed.

The concave is bored only in the beam line vacuum chamber wall of a part in which the cusp field forming magnet is arranged. Accordingly, the wall of the beam line vacuum chamber is made thin, and a structure is formed in which the beam line vacuum chamber can endure a vacuum pressure by strength of a part of no reduction in thickness.

In the case of each of the structures shown in FIGS. 15 and 18, the cusp field forming magnet is directly fixed in the concave of the beam line vacuum chamber, whereby the cusp field forming magnet can be considered as a part of the wall of the beam line vacuum chamber. Thus, strength of the beam line vacuum chamber can be obtained.

On the other hand, in the case of the structures shown in FIGS. 16 and 17, the cusp field forming magnet is fixed to the support member. Accordingly, when the beam line vacuum chamber is removed or attached, it can be individually handled without any effects of the cusp field forming magnet.

In addition, in the case of each of the structures shown in FIGS. 16 and 17, the support member can function as the insulator. Thus, the beam line vacuum chamber, the magnetic pole surface of the mass analysis magnet, and the support member attached to extend the magnetic pole surface of the mass analysis magnet can be set to different potentials.

In the case of the structure shown in FIG. 18, the cusp field forming magnet is directly arranged in the inner surface side of the beam line vacuum chamber. Thus, cusp field strength can be increased.

What is claimed is:

1. An ion beam processing method comprising the steps of extracting ions from an ion source as an ion beam by extraction electrode, analyzing ions by a mass analysis magnet apparatus for carrying out mass analyzing of the ions thus extracted and by a mass analysis slit for the ions that are mass analyzed by said mass analysis magnet apparatus to pass through, transporting the ions drifted or accelerated/decelerated, and implanting the ions in a substrate, a beam line structure extending from said ion source which generates the ions to said substrate to be implanted by the ions and including said mass analysis slit placed on said beam line structure between a rear section of said mass analysis magnet apparatus and said substrate, the analyzed ions passed through said mass analysis slit being directly implanted into said substrate by drifting transportation or being implanted into said substrate after acceleration or deceleration, and an acceleration electrode or a deceleration electrode placed on said beam line structure between a rear section of said mass analysis slit and said substrate, said ion beam being carried from said ion source to said substrate through said beam line structure, said ion beam being continuously surrounded with multiple magnet assemblies which generate cusp magnetic fields, further comprising the steps of:

confining the ion beam by the cusp magnetic fields jointed continuously to each other, said multiple magnet assemblies being disposed from a front section of the said mass analysis magnet apparatus being implanted into said substrate after acceleration or deceleration, and an acceleration electrode or a deceleration electrode placed on said beam line structure between a rear section of said mass analysis slit and said substrate, said ion beam being carried from said ion source to said substrate through said beam line structure, said ion beam being continuously surrounded with multiple magnet assemblies which generate cusp magnetic fields, some sections of said beam line structure being continuously surrounded with multiple magnet assemblies which generate cusp magnetic fields, further comprising the step of:

confining the ion beam by the cusp magnetic fields formed by a series of said multiple magnet assemblies disposed in the beam line structure from a vicinity of the extraction electrode through the mass analysis magnet apparatus and the mass analysis slit to a vicinity of the substrate.

2. The ion beam processing method according to claim 1, wherein the cusp magnetic field strength is almost periodic.

3. The ion beam processing method according to claim 1, wherein the cusp magnetic field is almost periodic but different in peak magnetic field strength in accordance with each section period of the beam line structure.

4. An ion beam processing method comprising the steps of extracting ions from an ion source as an ion beam by extraction electrode, analyzing ions by a mass analysis magnet apparatus for carrying out mass analyzing of the ions thus extracted and by a mass analysis slit for the ions that are mass analyzed by said mass analysis magnet apparatus to pass through, transporting the ions drifted or accelerated/decelerated, and implanting the ions in a substrate, a beam line structure extending from said ion source which generates the ions to said substrate to be implanted by the ions and including said mass analysis slit placed on said beam line structure between a rear section of said mass analysis magnet apparatus and said substrate, the analyzed ions passed through said mass analysis slit being directly implanted into said substrate by drifting transportation or transportation or being implanted into said substrate after acceleration or deceleration, and an acceleration electrode or a deceleration electrode placed on said beam line structure between a rear section of said mass analysis slit and said substrate, said ion beam being carried from said ion source to said substrate through said beam line structure, further comprising the steps of:

confining the ion beam by forming the beam line structure for transporting the ion beam from the ion source through the beam line vacuum chamber into the processing chamber, arranging the mass analysis magnet apparatus outside a partial section of the beam line vacuum chamber, disposing an effective magnetic field area of a magnetic pole surface of the mass analysis magnet apparatus in a partial section in the beam line structure, and forming a continuous cusp magnetic field in the beam line vacuum chamber of the effective magnetic field area of the mass analysis magnet apparatus in the beam line structure, wherein the magnetic poles for generating the cusp magnetic fields are positioned in a direction perpendicular to a path of the ion beam.

5. An ion beam processing method comprising the steps of extracting ions from an ion source as an ion beam by extraction electrode, analyzing ions by a mass analysis magnet apparatus for carrying out mass analyzing of the ions thus extracted and by a mass analysis slit for the ions that are mass analyzed by said mass analysis magnet apparatus to pass through, transporting the ions drifted or accelerated/decelerated, and implanting the ions in a substrate, a beam line structure extending from said ion source which generates the ions to said substrate to be implanted by the ions and including said mass analysis slit placed on said beam line structure between a rear section of said mass analysis magnet apparatus and said substrate, the analyzed ions passed through said mass analysis slit being directly implanted into said substrate by drifting transportation or being implanted into said substrate after acceleration or deceleration, and an acceleration electrode or a deceleration electrode placed on said beam line structure between a rear section of said mass analysis slit and said substrate, said ion beam being carried from said ion source to said substrate through said beam line structure, further comprising the steps of:

confining the ion beam by first cusp magnetic field formed by a series of magnet assemblies disposed in the beam line structure from a front section of the mass analysis magnet apparatus through the mass analysis magnet apparatus to a rear section of the mass analysis magnet apparatus, forming the periodic cusp magnetic field, so as to be almost equal magnetic field strength; and confining the ion beam by second cusp magnetic field, different magnetic field strength from the first cusp magnetic field, formed by a series of magnet assemblies disposed in the beam line structure from the first cusp magnetic field in the beam line structure between a rear section of the mass analysis magnet apparatus and a substrate processing chamber; and resulting in confining the ion beam substantially along the entire beam line structure.

6. The ion beam processing method according to claim 5, wherein intervals between cusp magnetic poles of the first and second cusp magnetic fields, or magnetic flux densities of the first and second cusp magnetic fields in the vicinity of the cusp magnetic poles are equal to each other.

7. The ion beam processing method according to claim 5, wherein intervals between cusp magnetic poles of the first and second cusp magnetic fields, or magnetic flux densities of the first and second cusp magnetic fields in the vicinity of the cusp magnetic poles are different from each other.

8. The ion beam processing method for an ion beam processing apparatus having a beam line vacuum chamber extending from an ion source to a processing chamber and comprising the steps of extracting ions from said ion source as an ion beam by extraction electrode, analyzing ions by a mass analysis magnet apparatus for carrying out mass analyzing of the ions thus extracted and by a mass analysis slit for the ions that are mass analyzed by said mass analysis magnet apparatus to pass through, transporting the ions drifted or accelerated/decelerated, and implanting the ions in a substrate, a beam line structure extending from said ion source which generates the ions to said substrate to be implanted by the ions and including said mass analysis slit placed on said beam line structure between a rear section of said mass analysis magnet apparatus and said substrate, the analyzed ions passed through said mass analysis slit being directly implanted into said substrate by drifting through said mass analysis magnet apparatus to a rear section of said mass analysis magnet apparatus on the beam line structure.

9. The ion beam processing method according to claim 8, wherein the continuous cusp magnetic field is formed by disposing a plurality of opposing cusp field apparatuses at the beam line vacuum chamber.

10. An ion beam processing method for an ion beam processing apparatus having a beam line vacuum chamber extending from an ion source to a processing chamber and comprising the steps of extracting ions from said ion source as an ion beam by extraction electrode, analyzing ions by a mass analysis magnet apparatus for carrying out mass analyzing of the ions thus extracted and by a mass analysis slit for the ions that are mass analyzed by said mass analysis magnet apparatus to pass through, transporting the ions drifted or accelerated/decelerated, and implanting the ions in a substrate, a beam line structure extending from said ion source which generates the ions to said substrate to be implanted by the ions and including said mass analysis slit placed on said beam line structure between a rear section of said mass analysis magnet apparatus and said substrate, the analyzed ions passed through said mass analysis slit being directly implanted into said substrate by drifting transportation or being implanted into said substrate after acceleration or deceleration, and an acceleration electrode or a deceleration electrode placed on said beam line structure between a rear section of said mass analysis slit and said substrate, said ion beam being carried from said ion source to said substrate through said beam line structure, further comprising the steps of:

confining the ion beam by forming the beam line structure for transporting the ion beam from the ion source through the beam line vacuum chamber into the processing chamber, arranging a mass analysis magnet apparatus outside a partial section of the beam line vacuum chamber, disposing an effective magnetic field area of a magnetic pole surface of the mass analysis magnet apparatus in a partial section in the beam line structure, and forming continuous cusp magnetic fields in a series of beam line vacuum chambers of the beam line structure from a front section of the mass analysis magnet apparatus before the effective magnetic field area through the effective magnetic field area of the magnetic pole surface of the mass analysis magnet apparatus to a rear section of the beam line structure outside the effective magnetic field area of the mass analysis magnet apparatus.

11. The ion beam processing method according to claim 10, wherein the continuous cusp magnetic fields are formed by disposing a plurality of opposing cusp field apparatuses at the beam line vacuum chamber.

12. An ion beam processing method for an ion beam processing apparatus having a beam line vacuum chamber extending from an ion source to a processing chamber and comprising the steps of extracting ions from said ion source as an ion beam by extraction electrode, analyzing ions by a mass analysis magnet apparatus for carrying out mass analyzing of the ions thus extracted and by a mass analysis slit for the ions that are mass analyzed by said mass analysis magnet apparatus to pass through, transporting the ions drifted or accelerated/decelerated, and implanting the ions in a substrate, a beam line structure extending from said ion source which generates the ions to said substrate to be implanted by the ions and including said mass analysis slit placed on said beam line structure between a rear section of said mass analysis magnet apparatus and said substrate, the analyzed ions passed through said mass analysis slit being directly implanted into said substrate by drifting transportation or being implanted into said substrate after acceleration or deceleration, and an acceleration electrode or a deceleration electrode placed on said beam line structure between a rear section of said mass analysis slit and said substrate, said ion beam being carried from said ion source to said substrate through said beam line structure, further comprising the steps of:

confining the ion beam by forming the beam the structure for transporting the ion beam from the ion source through the beam line vacuum chamber into the processing chamber, arranging a mass analysis magnet apparatus from the outside in a partial section of the beam line vacuum chamber, disposing an effective magnetic field area of a magnetic pole surface of the mass analysis magnet apparatus in a partial section in the beam line structure, and arranging magnet apparatuses for forming continuous cusp magnetic fields in a series of beam line vacuum chambers of the beam line structure from a front section of the mass analysis magnet apparatus before the effective magnetic field area through the effective magnetic field area of the magnetic pole surface of the mass analysis magnet apparatus to a rear section of the beam line structure outside the effective magnetic field area of the mass analysis magnet apparatus to form continuous cusp magnetic fields.

13. The ion beam processing method according to claim 12, wherein the continuous cusp magnetic fields are formed by disposing a plurality of opposing cusp field apparatuses at the beam line vacuum chamber.

14. An ion beam processing apparatus for extracting ions from an ion source as an ion beam by extraction electrode, analyzing ions by a mass analysis magnet apparatus for carrying out mass analyzing of the ions thus extracted and by a mass analysis slit for the ions that are mass analyzed by said mass analysis magnet apparatus to pass through, transporting the ions drifted or accelerated/decelerated, and implanting the ions in a substrate, the ion beam processing apparatus comprising a beam line structure extending from said ion source which generates the ions to said substrate to be implanted by the ions and comprising a beam line vacuum chamber extending from said ion source to a processing chamber, said mass analysis slit placed on said beam line structure between a rear section of said mass analysis magnet apparatus and said substrate, the analyzed ions passed through said mass analysis slit being directly implanted into said substrate by drifting transportation or being implanted into said substrate after acceleration or deceleration, and an acceleration electrode or a deceleration electrode placed on said beam line structure between a rear section of said mass analysis slit and said substrate, said ion beam being carried from said ion source to said substrate through said beam line structure, said beam line structure being for transporting the ion beam from the ion source through the beam line vacuum chamber to the processing chamber;

a said mass analysis magnet apparatus being arranged from the outside in a partial section of the beam line vacuum chamber, an effective magnetic field area of a magnetic pole surface of the mass analysis magnet apparatus being disposed in a partial section of the beam line structure; the ion beam processing apparatus further comprising:

continuous cusp magnetic field forming magnet apparatuses arranged at series of beam line vacuum chamber sections of the beam line structure to confine the ion beam by forming continuous cusp magnetic fields.

15. The ion beam processing apparatus according to claim 14, wherein a plurality of continuous cusp magnetic field forming magnets are fixed to be held at regular intervals directly on an inner wall of the beam line vacuum chamber located in a section between the inner wall of the beam line vacuum chamber and the magnetic pole surface of the mass analysis magnet apparatus.

16. The ion beam processing apparatus according to claim 14, wherein a plurality of continuous cusp magnetic field forming magnets are fixed to be held at regular intervals directly on an outer wall of the beam line vacuum chamber located in a section between the inner wall of the beam line vacuum chamber and the magnetic pole surface of the mass analysis magnet apparatus.

17. The ion beam processing apparatus according to claim 14, wherein a plurality of continuous cusp magnetic field forming magnets are fixed to be held at regular intervals inside the beam line vacuum chamber located in a section between the inner wall of the beam line vacuum chamber and the magnetic pole surface of the mass analysis magnet apparatus.

18. The ion beam processing apparatus according to claim 14, wherein a plurality of continuous cusp magnetic field forming magnets are fixed to be held at regular intervals directly on an outer wall of the magnetic pole surface located in a section between the inner wall of the beam line vacuum chamber and the magnetic pole surface of the mass analysis magnet apparatus.

19. The ion beam processing apparatus according to claim 14, wherein a plurality of continuous cusp magnetic field forming magnets are fixed to be held at regular intervals inside the magnetic pole surface located in a section between the inner wall of the beam line vacuum chamber and the magnetic pole surface of the mass analysis magnet apparatus.

20. An ion beam processing apparatus for extracting ions from an ion source as an ion beam by extraction electrode, analyzing ions by a mass analysis magnet apparatus for carrying out mass analyzing of the ions thus extracted and by a mass analysis slit for the ions that are mass analyzed by said mass analysis magnet apparatus to pass through, transporting the ions drifted or accelerated/decelerated, and implanting the ions in a substrate, the ion beam processing apparatus comprising a beam line structure extending from said ion source which generates the ions to said substrate to be implanted by the ions and comprising a beam line vacuum chamber extending from said ion source to a processing chamber, said mass analysis slit placed on said beam line structure between a rear section of said mass analysis magnet apparatus and said substrate, the analyzed ions passed through said mass analysis slit being directly implanted into said substrate by drifting transportation or being implanted into said substrate after acceleration or deceleration, and an acceleration electrode or a deceleration electrode placed on said beam line structure between a rear section of said mass analysis slit and said substrate, said ion beam being carried from said ion source to said substrate through said beam line structure, said beam line structure being for transporting the ion beam from the ion source through the beam line vacuum chamber to the processing chamber;

said mass analysis magnet apparatus being arranged from outside in a partial section of the beam line vacuum chamber, an effective magnetic field area of a magnetic pole surface of the mass analysis magnet apparatus being disposed in a partial section of the beam line structure; the ion beam processing apparatus further comprising:

magnet apparatuses for forming continuous cusp magnetic fields arranged at the continuous beam line vacuum chamber section of the beam line structure from a front section of the mass analysis magnet apparatus through the magnetic pole surface of the mass analysis magnet apparatus to a rear section of the beam line structure outside the effective magnetic field area of the mass analysis magnet apparatus to confine the ion beam by forming the continuous cusp magnetic fields.

21. The ion beam processing apparatus according to claim 20, wherein a plurality of continuous cusp magnetic field forming magnets are fixed to be held at regular intervals directly on an inner wall of the beam line vacuum chamber located in a section between the inner wall of the beam line vacuum chamber and the magnetic pole surface of the mass analysis magnet apparatus.

22. The ion beam processing apparatus according to claim 20, wherein a plurality of continuous cusp magnetic field forming magnets are fixed to be held at regular intervals directly on an outer wall of the beam line vacuum chamber located in a section between the inner wall of the beam line vacuum chamber and the magnetic pole surface of the mass analysis magnet apparatus.

23. The ion beam processing apparatus according to claim 20, wherein a plurality of continuous cusp magnetic field forming magnets are fixed to be held at regular intervals inside the beam line vacuum chamber located in a section between the inner wall of the beam line vacuum chamber and the magnetic pole surface of the mass analysis magnet apparatus.

24. The ion beam processing apparatus according to claim 20, wherein a plurality of continuous cusp magnetic field forming magnets are fixed to be held at regular intervals directly on an outer wall of the magnetic pole surface located in a section between the inner wall of the beam line vacuum chamber and the magnetic pole surface of the mass analysis magnet apparatus.

25. The ion beam processing apparatus according to claim 20, wherein a plurality of continuous cusp magnetic field forming magnets are fixed to be held at regular intervals inside the magnetic pole surface located in a section between the inner wall of the beam line vacuum chamber and the magnetic pole surface of the mass analysis magnet apparatus.

26. An ion beam processing apparatus for extracting ions from an ion source as an ion beam by extraction electrode, analyzing ions by a mass analysis magnet apparatus for carrying out mass analyzing of the ions thus extracted and by a mass analysis slit for the ions that are mass analyzed by said mass analysis magnet apparatus to pass through, transporting the ions drifted or accelerated/decelerated, and implanting the ions in a substrate, the ion beam processing apparatus comprising a beam line structure extending from said ion source which generates the ions to said substrate to be implanted by the ions and comprising a tubular beam line vacuum chamber extending from the ion source to a processing chamber, said mass analysis slit placed on said beam line structure between a rear section of said mass analysis magnet apparatus and said substrate, the analyzed ions passed through said mass analysis slit being directly implanted into said substrate by drifting transportation or being implanted into said substrate after acceleration or deceleration, and an acceleration electrode or a deceleration electrode placed on said beam line structure between a rear section of said mass analysis slit and said substrate, said ion beam being carried from said ion source to said substrate through said beam line structure, wherein said beam line structure is configured so that the ion beam is transported from the ion source to the processing chamber through the beam line vacuum chamber, the cross section of the beam line vacuum chamber is polygonal or circular, an inner side wall of the beam line vacuum chamber is made thin in a partial section or all sections of the beam line vacuum chamber; and reinforcing members are arranged outside the inner side wall;

wherein a plurality of continuous cusp magnetic field forming magnets are arranged at regular intervals as the reinforcing members.

27. The ion beam processing apparatus according to claim 26, wherein a partial section of the beam line vacuum chamber constituting the beam line structure includes a section of a mass analysis magnet apparatus arranged near the ion source of the beam line vacuum chamber constituting the beam line structure.

28. The ion beam processing apparatus according to claim 26, wherein the reinforcing members are arranged at regular intervals.

29. The ion beam processing apparatus according to claim 26, wherein the reinforcing members and a plurality of continuous cusp magnetic field forming magnets are alternately arranged at regular intervals.

30. The ion beam processing apparatus according to claim 26, wherein in accordance with the shape of the tubular beam line vacuum chamber which becomes polygonal or circular, the reinforcing members and a plurality of continuous cusp magnetic field forming magnets are alternately arranged at regular intervals in at least a group of opposing locations of the beam line vacuum chamber which becomes polygonal or circular.

31. The ion beam processing apparatus according to claim 26, wherein the reinforcing members are arranged as reinforcing ribs at proper intervals in a direction orthogonal to the beam line structure, in the same direction, or an oblique direction.

32. The ion beam processing apparatus according to claim 29, wherein the reinforcing members and the plurality of continuous cusp magnetic field forming magnets are alternately arranged closely.

33. The ion beam processing apparatus according to claim 29, wherein the inner side or outer side wall of the beam line vacuum chamber constituted to be thin is made thick in a part in which none of the reinforcing members are disposed, in accordance with the shape of the beam line vacuum chamber which becomes polygonal or circular.

34. The ion beam processing apparatus according to claim 26, wherein a plurality of continuous cusp magnetic field forming magnets are fixed to be held at regular intervals directly at the beam line vacuum chamber.

35. The ion beam processing apparatus according to claim 34, wherein concave parts are formed outside part of the beam line vacuum chamber to embed the plurality of continuous cusp magnetic field forming magnets, and thus the plurality of continuous cusp magnetic field forming magnets are arranged so as to be close to a vacuum area of an inside part of the beam line vacuum chamber.

36. The ion beam processing apparatus according to claim 35, wherein the plurality of continuous cusp magnetic field forming magnets are directly fitted into the concave parts of the beam line vacuum chamber and are fixed, and thus strength of the beam line vacuum chamber is increased.

37. An ion beam processing apparatus for extracting ions from an ion source as an ion beam by extraction electrode, analyzing ions by a mass analysis magnet apparatus for carrying out mass analyzing of the ions thus extracted and by a mass analysis slit for the ions that are mass analyzed by said mass analysis magnet apparatus to pass through, transporting the ions drifted or accelerated/decelerated, and implanting the ions in a substrate, the ion beam processing apparatus comprising a beam line structure extending from said ion source which generates the ions to said substrate to be implanted by the ions and comprising a beam line vacuum chamber extending from said ion source to a processing chamber, said mass analysis slit placed on said beam line structure between a rear section of said mass analysis magnet apparatus and said substrate, the analyzed ions passed through said mass analysis slit being directly implanted into said substrate by drifting transportation or being implanted into said substrate after acceleration or deceleration, and an acceleration electrode or a deceleration electrode placed on said beam line structure between a rear section of said mass analysis slit and said substrate, said ion beam being carried from said ion source to said substrate through said beam line structure, wherein:

said beam line structure is configured so that the ion beam is transported from the ion source to the processing chamber through the beam line vacuum chamber, the cross section of the beam line vacuum chamber is polygonal or circular, and an outer side wall of the beam line vacuum chamber is made thin in a partial section or all sections of the beam line vacuum chamber, the ion beam processing apparatus further comprising reinforcing members and inner wall members arranged inside the outer side wall wherein a plurality of continuous cusp magnetic field forming magnets are arranged at regular intervals as the reinforcing members.

38. The ion beam processing apparatus according to claim 37, wherein a partial section of the beam line vacuum chamber constituting the beam line structure includes a section of a mass analysis magnet apparatus arranged in a position near the ion source of the beam line vacuum chamber constituting the beam line structure.

39. The ion beam processing apparatus according to claim 37, wherein the reinforcing members are arranged at regular intervals.

40. The ion beam processing apparatus according to claim 37, wherein the reinforcing members and a plurality of continuous cusp magnetic field forming magnets are alternately arranged at regular intervals.

41. The ion beam processing apparatus according to claim 37, wherein in accordance with a shape of the beam line vacuum chamber which becomes polygonal or circular, the reinforcing members and a plurality of continuous cusp magnetic field forming magnets are alternately arranged at regular intervals in at least a group of opposing locations of the beam line vacuum chamber which becomes polygonal or circular.

42. The ion beam processing apparatus according to claim 37, wherein the reinforcing members are arranged as reinforcing ribs at proper intervals in a direction perpendicular to the beam line structure, in the same direction, or an oblique direction.

43. The ion beam processing apparatus according to claim 40, wherein the reinforcing members and the plurality of continuous cusp magnetic field forming magnets are alternately arranged closely.

44. The ion beam processing apparatus according to claim 40, wherein the inner side or outer side wall of the beam line vacuum chamber constituted to be thin is made thick in a part in which none of the reinforcing members are disposed, in accordance with the cross-sectional shape of the beam line vacuum chamber which becomes polygonal or circular.

45. The ion beam processing apparatus according to claim 37, wherein a plurality of continuous cusp magnetic field forming magnets are fixed at regular intervals directly to the beam line vacuum chamber.

46. The ion beam processing apparatus according to claim 45, wherein concave parts are formed outside part of the beam line vacuum chamber to embed the plurality of continuous cusp magnetic field forming magnets, and thus the plurality of continuous cusp magnetic field forming magnets are arranged so as to be close to the vacuum area of the inside part of the beam line vacuum chamber.

47. The ion beam processing apparatus according to claim 46, wherein the plurality of continuous cusp magnetic field forming magnets are directly fitted into the concave parts of the beam line vacuum chamber, and thus strength of the beam line vacuum chamber is increased.

48. An ion beam processing apparatus for extracting ions from an ion source as an ion beam by extraction electrode, analyzing ions by a mass analysis magnet apparatus for carrying out mass analyzing of the ions thus extracted and by a mass analysis slit for the ions that are mass analyzed by said mass analysis magnet apparatus to pass through, transporting the ions drifted or accelerated/decelerated, and implanting the ions in a substrate, the ion beam processing apparatus comprising a beam line structure extending from said ion source which generates the ions to said substrate to be implanted by the ions and comprising a beam line vacuum chamber extending from said ion source to a processing chamber, said mass analysis slit placed on said beam line structure between a rear section of said mass analysis magnet apparatus and said substrate, the analyzed ions passed through said mass analysis slit being directly implanted into said substrate by drifting transportation or being implanted into said substrate after acceleration or deceleration, and an acceleration electrode or a deceleration electrode placed on said beam line structure between a rear section of said mass analysis slit and said substrate, said ion beam being carried from said ion source to said substrate through said beam line structure, wherein:

said beam line structure comprises an effective magnetic field area of a magnetic pole surface of a mass analysis magnet apparatus in a partial section of a beam line vacuum chamber, and also the beam line structure comprises a plurality of continuous cusp magnetic field forming magnets arranged at the continuous beam line vacuum chamber part from a front section of the effective magnetic field area of the mass analysis magnet apparatus through the effective magnetic field area of the magnetic pole surface of the mass analysis magnet apparatus to a rear section of the effective magnetic field area of the mass analysis magnet apparatus, the plurality of continuous cusp magnetic field forming magnets being fixed at regular intervals to the magnet pole surface side of the mass analysis magnet apparatus by a hold member.

49. The ion beam processing apparatus according to claim 48, wherein in the beam line vacuum chamber of the front and rear sections of the effective magnetic field area of the mass analysis magnet apparatus, a support member for fixing the hold member is mounted on the magnetic pole surface of the mass analysis magnet apparatus, and the plurality of continuous cusp magnetic field forming magnets are fixed at regular intervals at the magnetic pole surface of the mass analysis magnet apparatus and the hold member by the support member.

50. The ion beam processing apparatus according to claim 48, wherein concave parts are formed in parts of the beam line vacuum chamber corresponding to the plurality of continuous cusp magnetic field forming magnets fixed at the fixed intervals in the magnetic pole surface of the mass analysis magnet apparatus and the hold member by the support member, and thus the plurality of continuous cusp magnetic field forming magnets are arranged so as to be close to a vacuum area of the inside part of the beam line vacuum chamber.

51. The ion beam processing apparatus according to claim 48, wherein a hold member, a support member, or a fixing member for fixing and holding the plurality of cusp magnetic field forming magnets arranged between the magnetic pole surface of the mass analysis magnet apparatus and the beam line vacuum chamber is implemented by an insulating material to function as an insulator between the magnetic pole surface of the mass analysis magnet apparatus and the beam line vacuum chamber.

52. The ion beam processing apparatus according to claim 14, wherein a plurality of cusp magnetic field forming magnets are fixed at regular intervals at the beam line vacuum chamber by a support member.

53. The ion beam processing apparatus according to claim 14, wherein concave parts are formed in the beam line vacuum chamber to arrange the cusp magnetic field forming magnets so as to be close to a vacuum area of an inside part of the beam line vacuum chamber.

54. The ion beam processing apparatus according to claim 14, wherein concave parts are formed only in a necessary part of the beam line vacuum chamber to form a part of no reduction in thickness, and strength is provided to prevent from destruction by atmospheric pressure.

55. The ion beam processing apparatus according to claim 14, wherein a support member for fixing and holding the cusp magnetic field forming magnets arranged between the magnetic pole surface of the mass analysis magnet apparatus and the beam line vacuum chamber is implemented by an insulating material to function as an insulator between the magnetic pole surface of the mass analysis magnet apparatus and the beam line vacuum chamber.

56. The ion beam processing apparatus according to claim 14, wherein a plurality of continuous cusp magnetic field forming magnets are fixed at regular intervals inside the beam line vacuum chamber.

57. The ion beam processing apparatus according to claim 56, wherein a magnet cover is disposed to prevent exposure of the cusp magnetic field forming magnets to the ion beam.

58. The ion beam processing apparatus according to claim 56, wherein the cusp magnetic field forming magnets are fixed to the beam line vacuum chamber directly or through a hold member.

59. The ion beam processing apparatus according to claim 56, wherein space parts are formed inside a wall of the beam line chamber to embed the plurality of continuous cusp magnetic field forming magnets.

60. The ion beam processing apparatus according to claim 56, wherein the cusp magnetic field forming magnets are fixed inside the beam line vacuum chamber through a cover hold member.

61. The ion beam processing apparatus according to claim 56, wherein concave parts are formed on an inside part of the beam line vacuum chamber to embed the plurality of continuous cusp magnetic field forming magnets, and thus the plurality of continuous cusp magnetic field forming magnets are arranged so as to be close to a vacuum area of the inside part of the beam line vacuum chamber.

62. The ion beam processing apparatus according to claim 20, wherein a plurality of the continuous cusp magnetic field forming magnets are fixed at regular intervals to the beam line vacuum chamber through a support member.

63. The ion beam processing apparatus according to claim 20, wherein concave parts are formed in the beam line vacuum chamber to arrange the plurality of continuous cusp magnetic field forming magnets so as to be close to a vacuum area of an inside part of the beam line vacuum chamber.

64. The ion beam processing apparatus according to claim 20, wherein concave parts are formed only in a necessary part of the beam line vacuum chamber to form a part of no reduction in thickness, and strength is provided to prevent from destruction by atmospheric pressure.

65. The ion beam processing apparatus according to claim 20, wherein a support member for fixing and holding the plurality of continuous cusp magnetic field forming magnets arranged between the magnetic pole surface of the mass analysis magnet apparatus and the beam line vacuum chamber is implemented by an insulating material to function as an insulator between the magnetic pole surface of the mass analysis magnet apparatus and the beam line vacuum chamber.

66. The ion beam processing apparatus according to claim 20, wherein a plurality of continuous cusp magnetic field forming magnets are fixed at regular intervals inside the beam line vacuum chamber.

67. The ion beam processing apparatus according to claim 66, wherein a magnet cover is disposed to prevent exposure of the cusp magnetic field forming magnets to the ion beam.

68. The ion beam processing apparatus according to claim 66, wherein the plurality of continuous cusp magnetic field forming magnets are fixed to the beam line vacuum chamber directly or through a hold member.

69. The ion beam processing apparatus according to claim 66, wherein space parts are formed inside a wall of the beam line chamber to embed the plurality of continuous cusp magnetic field forming magnets.

70. The ion beam processing apparatus according to claim 66, wherein the plurality of continuous cusp magnetic field forming magnets are fixed inside the beam line vacuum chamber through a cover hold member.

71. The ion beam processing apparatus according to claim 66, wherein concave parts are formed in the vacuum side of the beam line vacuum chamber to embed the plurality of continuous cusp magnetic field forming magnets, and thus the plurality of continuous cusp magnetic field forming magnets are arranged so as to be close to a vacuum area of an inside part of the beam line vacuum chamber.

72. An ion beam processing apparatus for extracting ions from an ion source as an ion beam by extraction electrode, analyzing ions by a mass analysis magnet apparatus for carrying out mass analyzing of the ions thus extracted and by a mass analysis slit for the ions that are mass analyzed by said mass analysis magnet apparatus to pass through, transporting the ions drifted or accelerated/decelerated, and implanting the ions in a substrate, the ion beam processing apparatus comprising a beam line structure extending from said ion source which generates the ions to said substrate to be implanted by the ions and comprising a beam line vacuum chamber extending from said ion source to a processing chamber, said mass analysis slit placed on said beam line structure between a rear section of said mass analysis magnet apparatus and said substrate, the analyzed ions passed through said mass analysis slit being directly implanted into said substrate by drifting transportation or being implanted into said substrate after acceleration or deceleration, and an acceleration electrode or a deceleration electrode placed on said beam line structure between a rear section of said mass analysis slit and said substrate, said ion beam being carried from said ion source to said substrate through said beam line structure, the ion beam processing apparatus comprising:

a continuous beam line structure from a front section of the mass analysis magnet apparatus through the mass analysis magnet apparatus to a rear section of the mass analysis magnet apparatus, the continuous beam line structure being constituted to be partially detachable in order to widen one magnetic pole surface of the mass analysis magnet apparatus in spacing with respect to the other magnetic pole surface.

* * * * *

UNITED STATES PATENT AND TRADEMARK OFFICE
CERTIFICATE OF CORRECTION

PATENT NO. : 6,797,968 B2
APPLICATION NO. : 10/329560
DATED : September 28, 2004
INVENTOR(S) : Mitsukuni Tsukihara et al.

It is certified that error appears in the above-identified patent and that said Letters Patent is hereby corrected as shown below:

Col. 29, line 56, should read as follows:

1. An ion beam processing method comprising the steps of extracting ions from an ion source as an ion beam by extraction electrode, analyzing ions by a mass analysis magnet apparatus for carrying out mass analyzing of the ions thus extracted and by a mass analysis slit for the ions that are mass analyzed by said mass analysis magnet apparatus to pass through, transporting the ions drifted or accelerated/decelerated, and implanting the ions in a substrate, a beam line structure extending from said ion source which generates the ions to said substrate to be implanted by the ions and including said mass analysis slit placed on said beam line structure between a rear section of said mass analysis magnet apparatus and said substrate, the analyzed ions passed through said mass analysis slit being directly implanted into said substrate by drifting transportation or being implanted into said substrate after acceleration or deceleration, and an acceleration electrode or a deceleration electrode placed on said beam line structure between a rear section of said mass analysis slit and said substrate, said ion beam being carried from said ion source to said substrate through said beam line structure, said ion beam being continuously surrounded with multiple magnet assemblies which generate cusp magnetic fields, further comprising the steps of:

confining the ion beam by the cusp magnetic fields jointed continuously to each other, said multiple magnet assemblies being disposed from a front section of the said mass analysis magnet apparatus ~~being implanted into said substrate after acceleration or deceleration, and an acceleration electrode or a deceleration electrode placed on said beam line structure between a rear section of said mass analysis slit and said substrate, said ion beam being carried from said ion source to said substrate through said beam line structure, said ion beam being continuously surrounded with multiple magnet assemblies which generate cusp magnetic fields, some sections of said beam line structure being continuously surrounded with multiple magnet assemblies which generate cusp magnetic fields, further comprising the step of:~~

UNITED STATES PATENT AND TRADEMARK OFFICE
CERTIFICATE OF CORRECTION

PATENT NO. : 6,797,968 B2
APPLICATION NO. : 10/329560
DATED : September 28, 2004
INVENTOR(S) : Mitsukuni Tsukihara et al.

It is certified that error appears in the above-identified patent and that said Letters Patent is hereby corrected as shown below:

Col. 29, line 56, should read as follows: (cont'd)

~~confining the ion beam by the cusp magnetic fields formed by a series of said multiple magnet assemblies disposed in the beam line structure from a vicinity of the extraction electrode~~ through ~~the~~ said mass analysis magnet apparatus to a rear section of said ~~and the~~ mass analysis ~~slit to a vicinity of the substrate~~ magnet apparatus on the beam line structure.

Signed and Sealed this

Second Day of October, 2007

JON W. DUDAS
*Director of the United States Patent and Trademark Office*